(12) United States Patent
Nakajima et al.

(10) Patent No.: US 6,338,000 B1
(45) Date of Patent: Jan. 8, 2002

(54) METHOD OF GENERATING SHAPE DATA METHOD OF VERIFYING SHAPE DATA

(75) Inventors: Ayumi Nakajima, Sayama; Masahiko Shimono, Utsunomiya; Kazuo Ito, Sayama; Hideki Taoka, Kodaira, all of (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/040,473

(22) Filed: Mar. 18, 1998

(30) Foreign Application Priority Data

| Mar. 24, 1997 | (JP) | ................................. | 9-70162 |
| Mar. 24, 1997 | (JP) | ................................. | 9-70164 |
| Mar. 24, 1997 | (JP) | ................................. | 9-70169 |
| Mar. 24, 1997 | (JP) | ................................. | 9-70172 |
| Mar. 24, 1997 | (JP) | ................................. | 9-70178 |

(51) Int. Cl.$^7$ .............................................. G06F 19/00
(52) U.S. Cl. ........................... 700/97; 700/182; 700/83; 345/964
(58) Field of Search .................... 700/97, 182, 165, 700/184, 187, 83; 345/964, 966

(56) References Cited

U.S. PATENT DOCUMENTS

| 4,805,438 A | * | 2/1989 | Ginn, Jr. et al. ............... 72/384 |
| 5,508,935 A | * | 4/1996 | Pourboghrat ........... 364/468.03 |
| 5,552,995 A | | 9/1996 | Sebastian |
| 5,740,691 A | * | 4/1998 | Kovarovic et al. ........... 72/306 |
| 5,844,801 A | * | 12/1998 | Kodama et al. ........ 364/468.17 |
| 5,969,973 A | * | 10/1999 | Bourne et al. ......... 364/474.07 |
| 5,971,589 A | * | 10/1999 | Hazama et al. ........ 364/472.01 |
| 5,979,208 A | * | 11/1999 | Hartley ........................ 72/306 |
| 5,980,085 A | * | 11/1999 | Uemura et al. ........ 364/468.03 |
| 6,029,334 A | * | 2/2000 | Hartley ........................ 29/464 |
| 6,035,242 A | * | 3/2000 | Uemura et al. ............... 700/97 |

FOREIGN PATENT DOCUMENTS

| EP | 0419013 A2 | 3/1991 |
| GB | 2274376 | 7/1994 |
| GB | 2295701 | 6/1996 |

* cited by examiner

*Primary Examiner*—David Wiley
*Assistant Examiner*—Firmin Backer
(74) *Attorney, Agent, or Firm*—Birch, Stewart, Kolasch & Birch, LLP

(57) ABSTRACT

Shape data relative to a hemmed edge in view of production technique requirements is added to shape data relative to a design surface using a CAD system. Curvatures of curved lines, curvatures of curved surfaces, offsets and distances between shape surfaces, and angles between shape surfaces of the shape data are analyzed and verified.

20 Claims, 27 Drawing Sheets

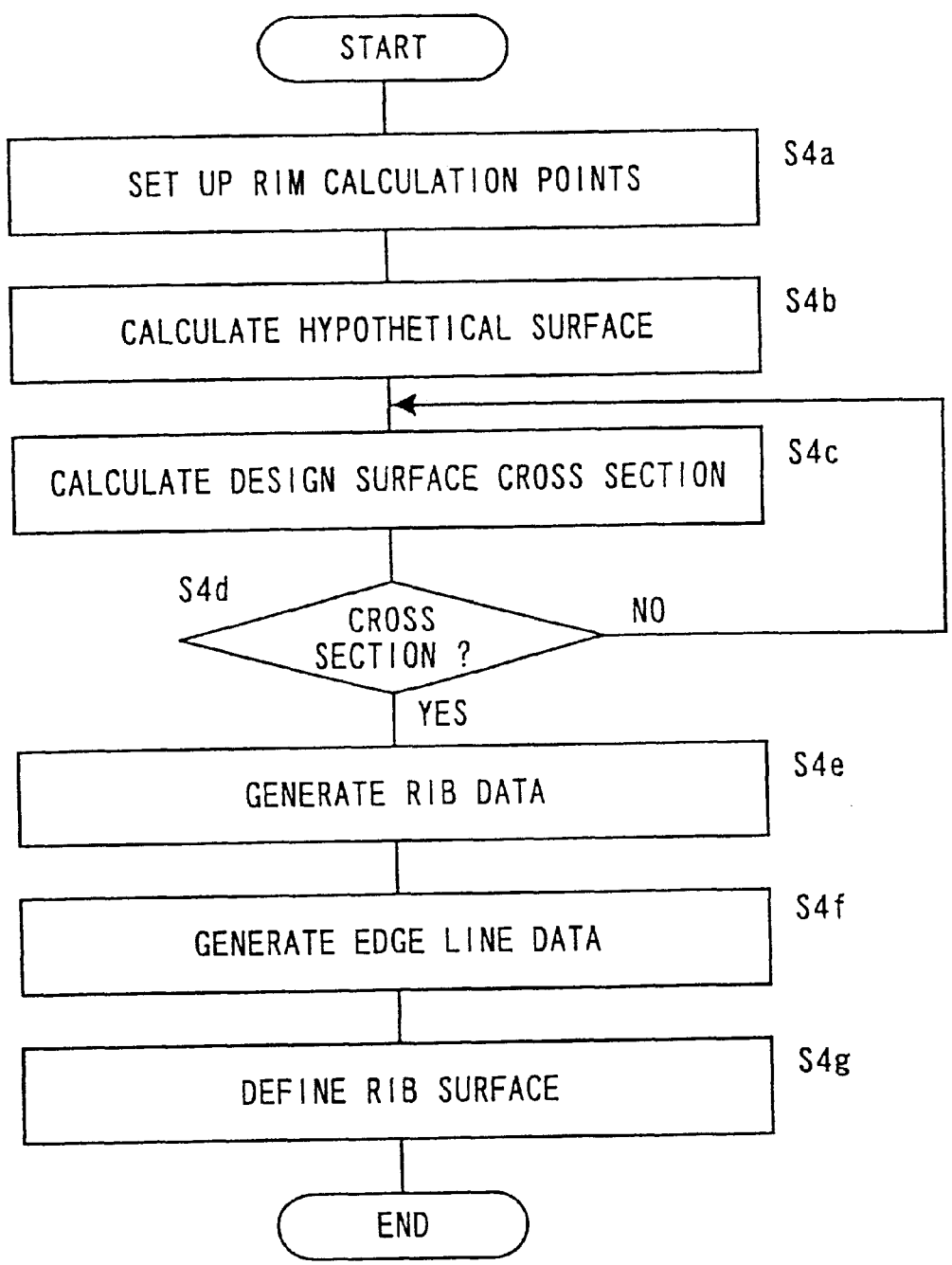

FIG. 8

| RIB | NUMBER OF RIBS | RIB NUMBER m |
|---|---|---|
| FACE RIB | n1 | 1, 2, 3···· |
| BACK RIB | n2 | 1, 2, 3···· |

FIG. 11

| RIB NUMBER m | CALCULATED RIB POSITION | | | P0 COORDINATE | | | P1 COORDINATE | | | P2 COORDINATE | | | P3 COORDINATE | | | FACE RIB DATA | BACK RIB DATA |
|---|---|---|---|---|---|---|---|---|---|---|---|---|---|---|---|---|---|
| | Xc | Yc | Zc | X0 | Y0 | Z0 | X1 | Y1 | Z1 | X2 | Y2 | Z2 | X3 | Y3 | Z3 | | |
| 1 | | | | | | | | | | | | | | | | | |
| 2 | | | | | | | | | | | | | | | | | |
| 3 | | | | | | | | | | | | | | | | | |

FIG. 14

| VERIFICATION NO. | NAME OF DATA TO BE VERIFIED | PART TO BE VERIFIED | ANALYTIC FUNCTION | DECISION REFERENCE VALUE | VERIFICATION RESULTS | ANALYTIC IMAGE DIAGRAM NO. |
|---|---|---|---|---|---|---|
| 1 | A | ENGINE FOOD | ANALYSIS OF CURVATURE OF CURVED LINE | ⋮ | OK | 1 |
| 2 | B | ROOF | ANALYSIS OF CURVATURE OF CURVED SURFACE | ⋮ | NG | 2 |
| 3 | C | FENDER | ANALYSIS OF DISTANCE | ⋮ | OK | 3 |
| 4 | D | DOOR | ANALYSIS OF ANGLE | ⋮ | NG | 4 |
| ⋮ | ⋮ | ⋮ | ⋮ | ⋮ | ⋮ | ⋮ |

|  |  | GAUSSIAN CURVATURE K | | |
|---|---|---|---|---|
|  |  | + | ±0 | − |
| AVERAGE CURVATURE H | + | COMPLETELY CONVEX | CONVEX FILLET | CONCAVE AND CONVEX |
|  | ±0 |  | FLAT |  |
|  | − | COMPLETELY CONCAVE | CONCAVE FILLET | CONCAVE AND CONVEX |

FIG. 24

| γ | DISPLAY PATTERN | DISPLAY COLOR |
|---|---|---|
| $-3\varepsilon$ | ∪ | RED |
| $-\varepsilon$ | ∪ | YELLOW |
| $\varepsilon$ | Z | GREEN |
| $+\varepsilon$ | ∪ | PALE AQUA |
| $+3\varepsilon$ | ∪ | WHITE |

METHOD OF GENERATING SHAPE DATA METHOD OF VERIFYING SHAPE DATA

BACKGROUND OF THE INVENTION

1. Field of the Invention

The present invention relates to a method of generating shape data with a CAD (Computer-Aided Design) system, and a method of verifying shape data of a product designed by a CAD system.

2. Description of the Related Art

Heretofore, shape data of an automobile body have been generated as follows: A mock-up is formed of synthetic resin or clay, and the shapes of the mock-up are judged by human body designers according to their senses and organoleptic evaluations. Based on the judgment, the shapes are modified if necessary. Thereafter, the mock-up is three-dimensionally scanned by a scanning machine to generate shape data.

The above conventional process involves many steps and takes a long period of time to carry out. Furthermore, the finally produced shape data tend to suffer quality differences because of individual differences of different body designers.

Recent rapid advances in the computer technology have made it possible to construct a virtual mock-up on a CAD system, displaying images of an automobile body for design modifications. One known CAD system allows a body designer to evaluate convex and concave facets for each body section, and also permits a body designer to determine the degree of curvature of a displayed designed line according to curvature calculations and displays the calculated curvature with line segments depending on the curvature for the body designer to make design evaluations.

A surface virtually constructed on a CAD system comprises a plurality of free curved surfaces joined together. In order to produce an automobile body having smoothly blending surfaces, the CAD system is capable of verifying the joined states of the free curved surfaces in terms of shape data. Specifically, a vector tangential to a boundary line between free curved surfaces is determined, and a plain normal to the tangential vector is defined. Then, lines of intersection between the plain and the free curved surfaces are determined, and angles formed between the lines of intersection are determined for verifying the joined state of the free curved surfaces.

Based on the results of evaluations and verifications, the design is corrected, and shape data for machining dies are generated from the corrected design. Dies are then produced on the basis of the shape data, and various parts of automobile bodies are manufactured using the produced dies.

Even though the curvature is displayed for design evaluation, it is highly difficult for the body designer to judge whether requirements or conditions for producing machined dies are good or not, immediately from the magnitude of the displayed curvature.

In addition, verifying the joined state of the free curved surfaces at many verification points on a boundary line would result in a considerably long period of processing time.

Design data supplied to a CAD system do not take into account structural details of actual products, material properties of the products, and shape limitations based on the structures of dies that are used to manufacture the products, but are representative of only design aspects. If a design is to be evaluated using only design data, then the following problems arise:

Parts that are manufactured on the basis of shape data are bent, hemmed, and trimmed at their peripheral edges for the purpose of connecting them to other parts or keeping certain outer profiles. For example, FIGS. 27 and 28A–28C of the accompanying drawings show a design surface of a hood 2 generated by a body designer and cross-sectional shapes of various hemmed edges of the hood 2. FIGS. 28A–28C show cross-sectional shapes taken along lines 28A—28A, 28B—28B, 28C—28C of FIG. 27 which shows the design surface of the hood 2. The design surface shown in FIG. 27 illustrates the lines 28A—28A, 28B—28B, 28C—28C, but not the details of the cross-sectional shapes along those lines. Therefore, it is necessary to indicate the hemmed edges shown in FIGS. 28A–28C as production technique requirements, generate shape data of the hemmed edges based on the indications, and add the generated shape data to the shape data for manufacturing the hood 2.

When the design surface of the hood 2 and the hemmed edges thereof are actually formed with dies, the portions of the design surface near the hemmed edges tend to be deformed as the hemmed edges are formed.

Since the design surface of the hood 2 contains a relatively large planar area, the hood 2 which is actually manufactured will possibly be deformed due to gravity. Consequently, when dies are fabricated precisely from design data, a product actually manufactured from the dies may not have a desired design. Furthermore, structural limitations of the dies may make it difficult to manufacture a product exactly to a desired design. For these reasons, it is difficult for a body designer to perform real evaluations on a design unless the body designer considers production technique requirements for manufacturing parts.

There is an instance where, as show in FIGS. 29 and 30 of the accompanying drawings, the body designer wishes to verify an offset $\alpha$ and a distance $\beta$ between two adjacent parts 4a, 4b with hemmed edges. In a three-dimensional space, the offset $\alpha$ and the distance $\beta$ may not properly be visually observed depending on the direction in which the body designer sees the parts 4a, 4b, especially due to the presence of the hemmed edges. Accordingly, design surfaces including hemmed edges cannot accurately be verified unless shape data of those hemmed edges are added to the design surfaces.

FIG. 30 shows a cross-sectional shape taken along line 30—30 of FIG. 29. If the part 4a is a front fender for an automobile body and the part 4b is a door next to the front fender, then the offset $\alpha$ is a predetermined quantity for positioning a lower portion of the door inwardly of a lower portion of the front fender with respect to the automobile body, and is normally referred to as a tipping requirement. The distance $\beta$ is a tolerant quantity for the gap between the front fender and the door. These quantities have to be set to predetermined values insofar as they will not impair the desired design.

It has heretofore been customary to verify the offset $\alpha$ and the distance $\beta$ based on shape data generated in the manner described above, on either a plurality of displayed three-dimensional shapes which are viewed in different directions or a cross-sectional shape determined at certain reference points.

According to such a verifying process, however, it may not be possible for the body designer to grasp specific quantities of the offset $\alpha$ and the distance $\beta$.Even if quantities of the offset $\alpha$ and the distance $\beta$ can be determined at a certain cross section, the entire number of steps of the verifying process is large because many cross sections need to be calculated in order to evaluate the offset α and the distance β of the parts in their entirety.

Shape data of a hemmed edge have conventionally been generated as shown in FIGS. 31A–31E of the accompanying drawings. A given design surface 6 (see FIG. 31A) is cut at corners thereof, producing a design surface 7 (see FIG. 31B). Then, a hemmed flange 8 is set up on the edge of the design surface 7 (see FIG. 31C). A fillet 10 is then set up between the design surface 7 and the hemmed flange 8 (see FIG. 31D). Shape data of the fillet 10 can be generated as by setting an arc in contact with the design surface 7 and the hemmed flange 8 and generating the arc successively along the edge of the design surface 7. After the fillet 10 is set up, the hemmed flange 8 is deleted, thereby producing a design surface 9 having a desired hemmed edge constructed as the fillet 10 (see FIG. 31E).

The above conventional practice of generating shape data of a hemmed edge requires wasteful steps and processing time because the shape data of the hemmed flange 8, which will not be required as final shape data, have to be generated. Moreover, the generating practice itself is complex and time-consuming, and may lead to errors in generating shape data.

SUMMARY OF THE INVENTION

It is a general object of the present invention to provide a method of generating shape data of a hemmed edge around a design surface highly easily and quickly.

Another general object of the present invention is to provide a method of verifying shape data of a product highly easily and reliably by taking into account production technique requirements.

A major object of the present invention is to provide a method of verifying, highly easily and reliably, the curvature of an arbitrary curved line on a shape which is composed of shape data of a product.

Another major object of the present invention is to provide a method of verifying, highly easily and reliably, the curvature of an arbitrary curved surface on a shape which is composed of shape data of a product.

Still another major object of the present invention is to provide a method of determining easily the joined state of a plurality of shapes which are composed of shape data of a product and verifying the joined state highly easily and reliably.

Yet still another major object of the present invention is to provide a method of determining easily an offset and a distance between outer contour lines of adjacent shapes which are composed of shape data of a product and verifying the offset and the distance highly easily and reliably.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 4 is a flowchart of a processing sequence of the method of generating shape data;

FIG. 8 is a table of data of the calculated hemmed edge in the method of generating shape data;

FIG. 11 is a table of hemmed edge data used in the method of generating shape data;

FIG. 14 is a table of verification results;

FIG. 17 is a table illustrative of the relationship between the shapes of curved surfaces and Gaussian and average curvatures;

FIG. 24 is a table of displayed patterns and displayed colors as a result of the angle analyzing process;

DETAILED DESCRIPTION OF THE PREFERRED EMBODIMENT

Figure 1:
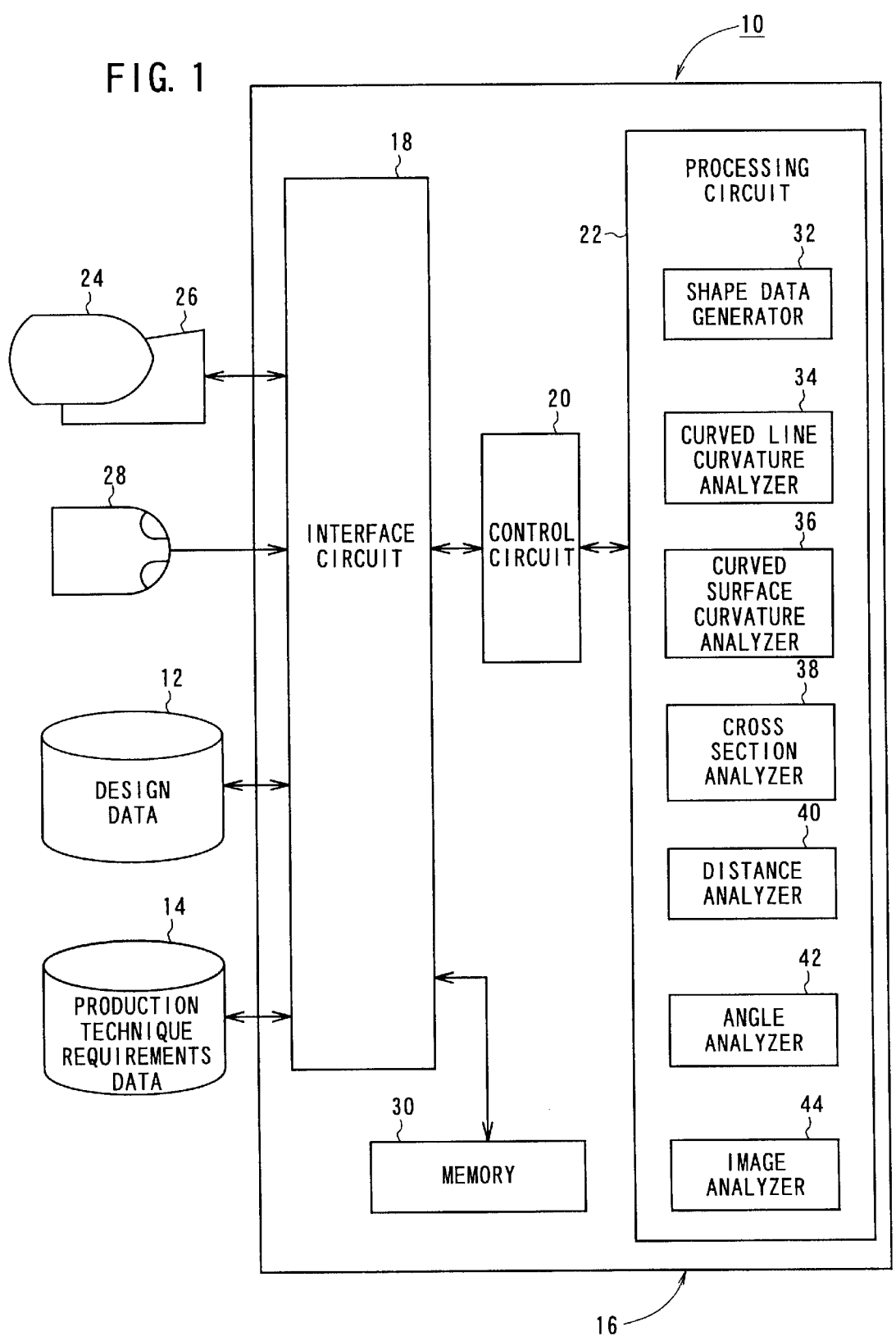
FIG. 1 is a block diagram of a CAD system for carrying out a method of generating shape data and a method of verifying shape data according to the present invention.

As shown in FIG. 1, a CAD system 10 for carrying out a method of generating shape data and a method of verifying shape data according to the present invention basically comprises a design data storage unit 12 for storing design data of automobile bodies, a production technique requirements data storage unit 14 for storing production technique requirements data for manufacturing automobile bodies, and a shape data generating and verifying apparatus 16 for generating shape data of automobile bodies from the design data and verifying the generated shape data.

The design data storage unit 12 stores design data as a surface model including surface information that has been generated according to automobile body design information at an upstream site. The production technique requirements data storage unit 14 stores production technique requirements data representing material properties, including a weight, of a product manufactured on the basis of the design data, conditions due to structural limitations of dies for manufacturing the product, and the shape of hemmed edge, with respect to regions of the product which are added to the design data.

The shape data generating and verifying apparatus 16 has an interface circuit 18, a control circuit 20, and a processing circuit 22. To the interface circuit 18, there are connected a display unit 24, a keyboard 26, a mouse 28, and a memory 30 for storing working data. The design data storage unit 12 and the production technique requirements data storage unit 14 are also connected to the interface circuit 18. The control circuit 20 controls overall operation of the shape data generating and verifying apparatus 16. The processing circuit 22 generates shape data comprising design data and hemmed edge data added thereto, displays three-dimensional shapes of parts of an automobile body based on the generated shape data, and performs various verifying processes.

The processing circuit 22 comprises a shape data generator 32, a curved line curvature analyzer 34, a curved surface curvature analyzer 36, a cross section analyzer 38, a distance analyzer 40, an angle analyzer 42, and an image analyzer 44.

As shown in FIGS. 2A–2D, the shape data generator 32 sets up a hemmed edge 46 based on production technique requirements data with respect to a design surface 6 which comprises design data, for thereby generating shape data that represents a complete shape surface 48.

The curved line curvature analyzer 34 determines the curvature of an arbitrary curved line on the complete shape surface 48 or the design surface 6, and analyzes the curvature to see if the curvature falls within a predetermined range or not, for thereby determining whether the shape data are acceptable or not.

The curved surface curvature analyzer 36 determines the curvature of an arbitrary curved surface on the complete shape surface 48 or the design surface 6, and analyzes convexities and concavities from the curvature for thereby determining whether the shape data are acceptable or not.

The cross section analyzer 38 determines an arbitrary cross-sectional shape of the complete shape surface 48 or the design surface 6, and analyzes the cross-sectional shape for thereby determining whether the cross-sectional shape is acceptable or not.

Figure 30:
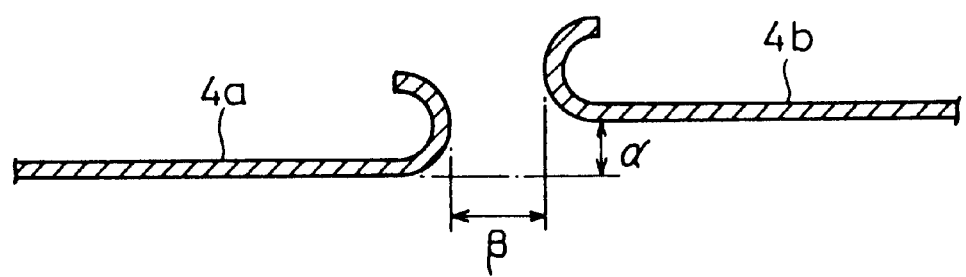
FIG. 30 is a cross-sectional view taken along line 30—30 of FIG. 29, showing an offset and a distance between the two adjacent parts shown in FIG. 29.
Figure 31A:
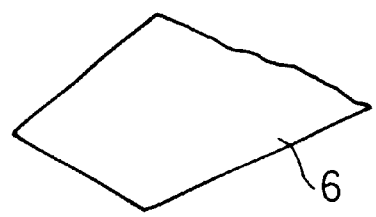
FIGS. 31A–31E are fragmentary perspective views illustrative of a conventional method of generating shape data.
Figure 31B:
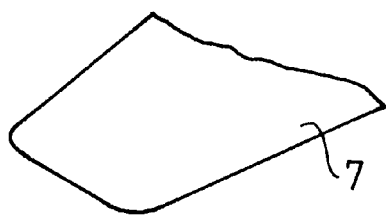
Figure 31C:
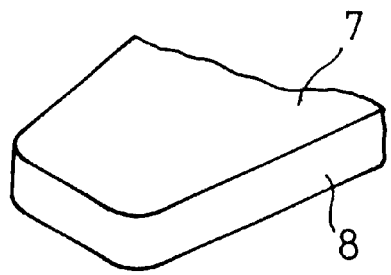
Figure 31D:
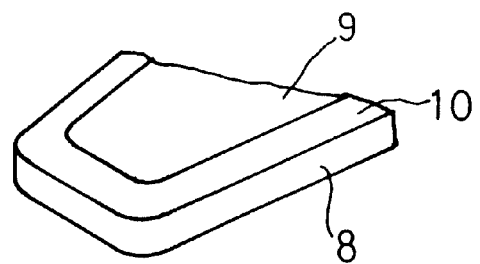
Figure 31E:
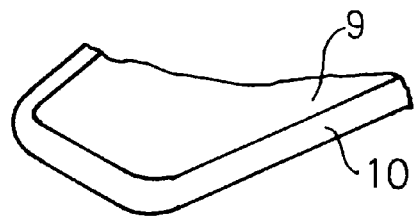

The distance analyzer 40 analyzes an offset α and a distance β (see FIG. 30) between adjacent complete shape surfaces 48 when a three-dimensional shape of an automobile body is viewed in an arbitrary direction, for thereby determining whether the complete shape surfaces 48 are acceptable or not.

The angle analyzer 42 analyzes an angle at which surfaces of the complete shape surface 48 or the design surface 6 are joined to each other, for thereby determining whether these are acceptably joined or not.

The image analyzer 44 displays a three-dimensional shape of an automobile body as viewed in an arbitrary direction on the display unit 24 based on shape data generated by the shape data generator 32, and displays analytical decision data produced by the curved line curvature analyzer 34, the curved surface curvature analyzer 36, the distance analyzer 40, and the angle analyzer 42 for desired analyses.

The method of generating shape data and the method of verifying shape data according to the present invention, which are carried out using the CAD system 10, will be described below.

Figure 2A:
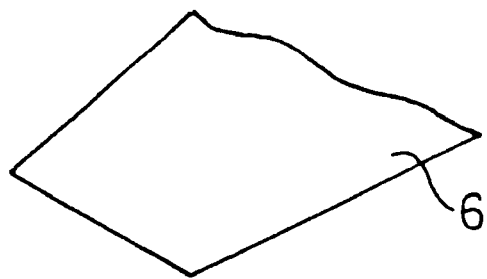
FIGS. 2A–2D are fragmentary perspective views illustrative of the method of generating shape data.

The control circuit 20 reads design data from the design data storage unit 12 through the interface circuit 18, and stores the design data into the memory 30. As shown in FIG. 2A, the design data represent only a design surface 6.

Figure 2B:
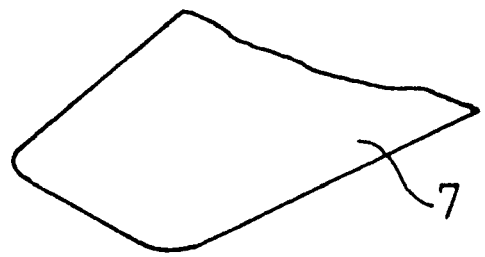
Figure 3A:
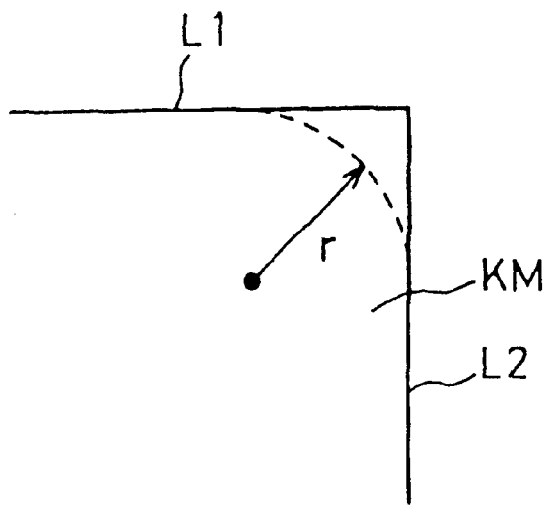
FIGS. 3A and 3B are diagrams illustrative of a process of generating an arc at a corner of a design surface.

The shape data generator 32 processes the data to make corners of the design surface 6 arcuate in shape, thus generating shape data of a design surface 7, as shown in FIG. 2B. This process of making corners arcuate in shape will be described below with reference to FIGS. 3A and 3B.

Figure 3B:
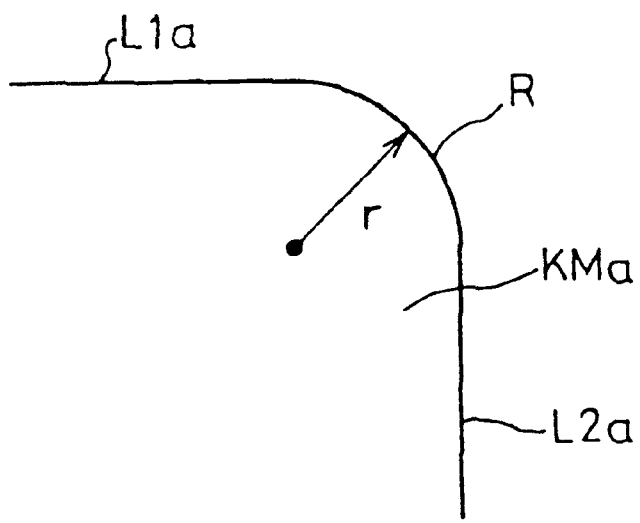

When a design surface KM (see FIG. 3A) bounded by edge lines L1, L2 is given as design data, the operator of the CAD system 10 selects the edge lines L1, L2, and indicates a radius r of an arc R to be formed between the edge lines L1, L2. Thereafter, the shape data generator 32 generates the arc R as shown in FIG. 3B.

Specifically, the shape data generator 32 generates a circle having the radius r, and divides the edge lines L1, L2 at points where the edge lines L1, L2 contact the circle, thereby generating new edge lines L1a, L2a and an arc R. Then, the shape data generator 32 sets up a surface loop with respect to a new design surface KMa whose boundary lines are the edge lines L1a, L2a and the arc R. The surface loop refers to data defining that the boundaries of the design surface KMa are established successively in the order of the edge line L1a, the arc R, and the edge line L2a.

Figure 2C:
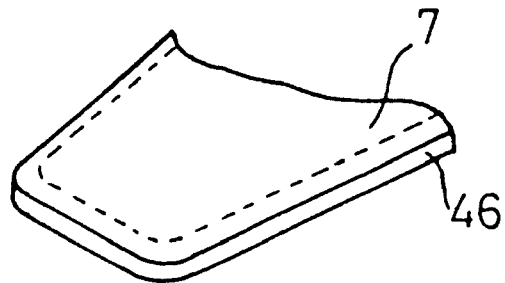

After the design surface 7 has been set up, a hemmed edge 46 is set up on the design surface 7 as shown in FIG. 2C. A process of setting up the hemmed edge 46 will be described below with reference to FIGS. 4–11.

Figure 6:
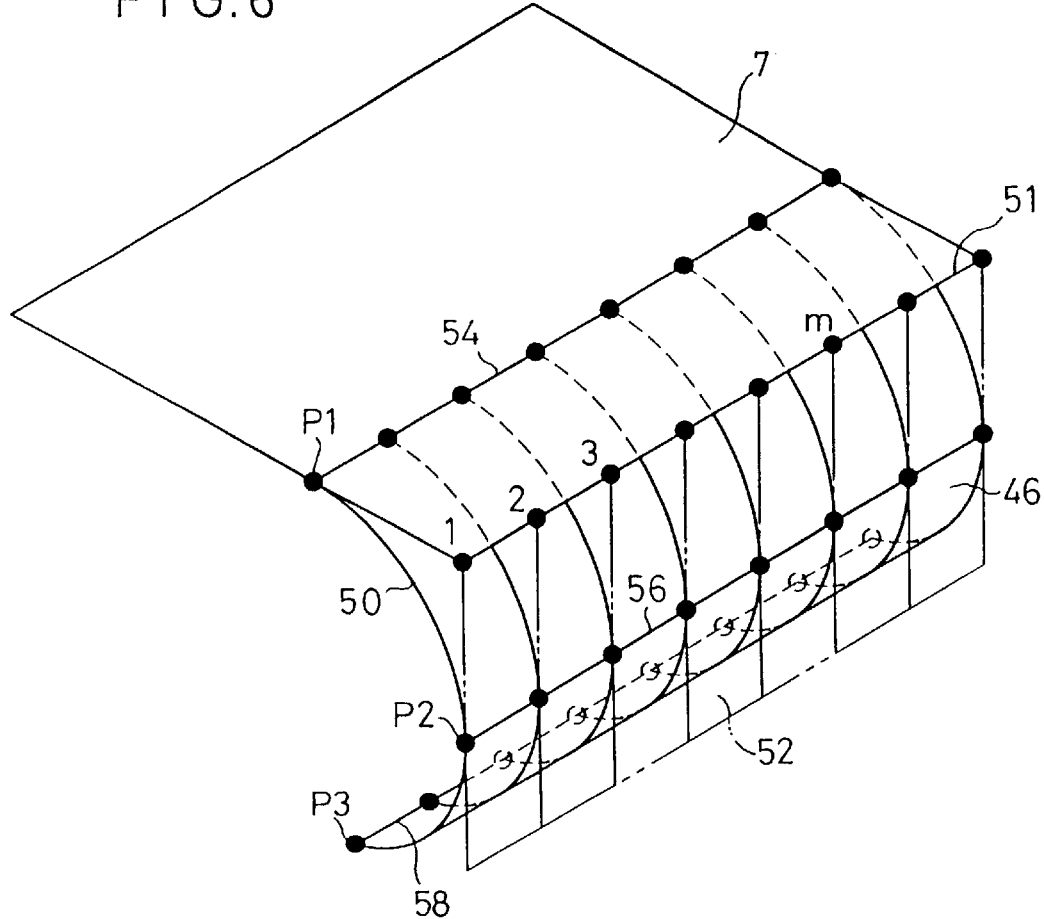
FIG. 6 is a diagram illustrative of a process of generating a hemmed edge in the method of generating shape data.

First, as shown in FIG. 6, rib calculating points for calculating ribs 50 are set up on a design line 51 along a peripheral edge of the design surface 7 on which the hemmed edge 46 is to be set up, and are allotted respective rib numbers m (m=1, 2, . . . ) in a step S4a. The ribs 50 represent a group of lines which make up the hemmed edge 46, and hence will finally define the hemmed edge 46.

Figure 28A:
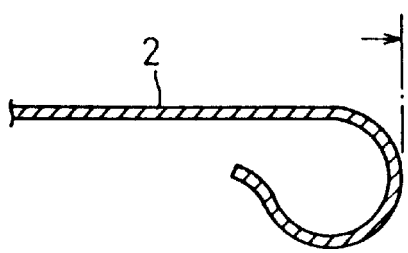
FIGS. 28A–28C are cross-sectional views taken along lines of FIG. 27, showing cross-sectional shapes of hemmed edges of the design surface shown in FIG. 27.
Figure 28B:
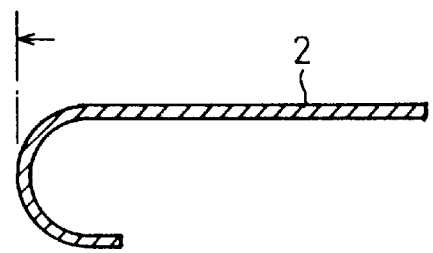
Figure 28C:
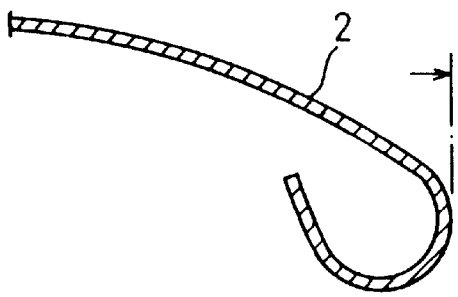
Figure 29:
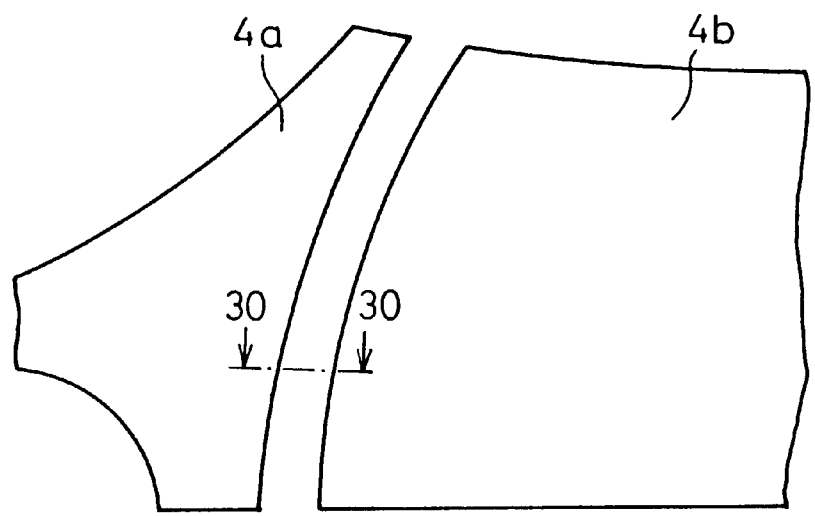
FIG. 29 is a view of two adjacent parts.

Then, a hypothetical surface 52 is calculated and set up with respect to the design line 51 based on the production technique requirements data read from the production technique requirements data storage unit 14 in a step S4b. The hemmed edge 46 to be set up on the design surface 7 differs at different regions of the design surface 7, as shown in FIGS. 28A–28C, for example, and the hypothetical surface 52 corresponding to the hemmed edge 46 is determined according to the production technique requirements data. Since the hypothetical surface 52 is used for the purpose of generating the ribs 50 as a group of lines, the hypothetical surface 52 may be such that it can define line segments passing through the respective rib calculating points on the design line 51, and hence can be calculated with utmost ease.

Figure 7:
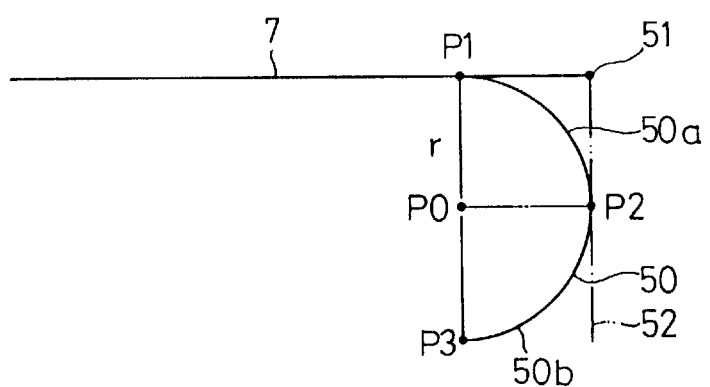
FIG. 7 is a diagram illustrative of the process of generating a hemmed edge in the method of generating shape data.

FIG. 8 shows a table of data of the hemmed edge 46 thus calculated. As shown in FIG. 7, each of the ribs 50 comprises an arcuate face rib 50a extending from a node P1 on the design surface 7 to a node P2 on the hypothetical surface 52, and an arcuate back rib 50b extending from the node P2 to a node P3 remote from the node P1, the nodes P1, P3 being symmetrical with respect to a center P0 of the rib 50. In some rib calculating points, only the face rib 50a exists or both the face and back ribs 50a, 50b exist. The table shown in FIG. 8 contains data relative to those ribs 50 that need to be determined, i.e., the number n1 of face ribs 50a and their rib numbers m, and the number n2 of back ribs 50b and their rib numbers m. Each of the rib numbers m is associated with shape data of the hypothetical surface 52 that is determined according to the production technique requirements data.

After the hypothetical surface 52 is set up, a cross section of the design surface 7 which passes through one of the rib calculating points is calculated in a step S4c. FIG. 7 illustrates the cross section of the design surface 7 which passes through one of the rib calculating points, and the rib 50 and the hypothetical surface 52 which are set up with respect to the cross section.

It is then determined whether such a cross-section exists or not in a step S4d. If no cross-section exists (NO in the step S4d), then a cross section of the design surface 7 which passes through a next one of the rib calculating points is calculated in the step S4c. If a cross-section exists (YES in the step S4d), then a next process of generating rib data is carried out in a step S4e.

Figure 5:
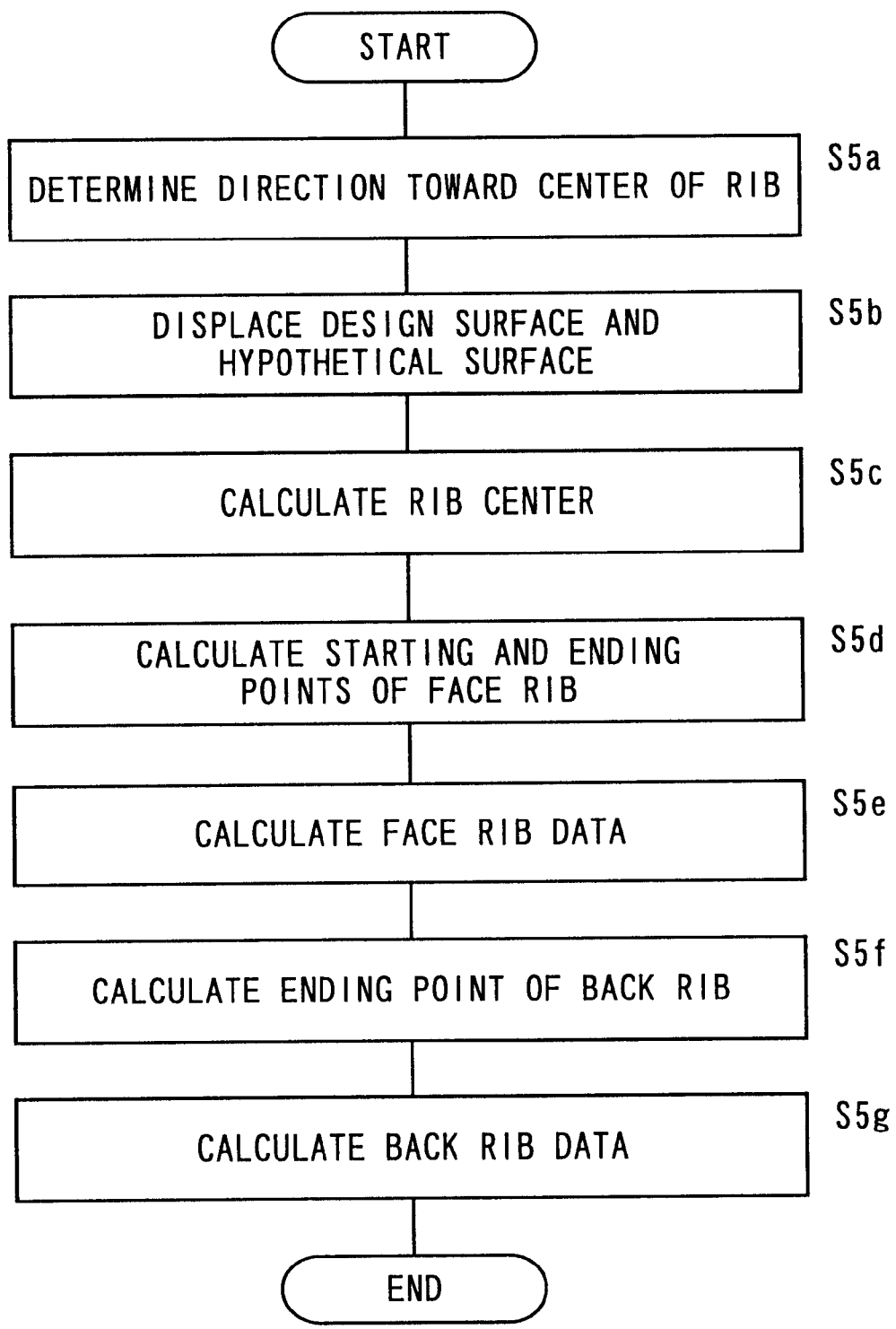
FIG. 5 is a flowchart of a processing sequence of the method of generating shape data.
Figure 9A:
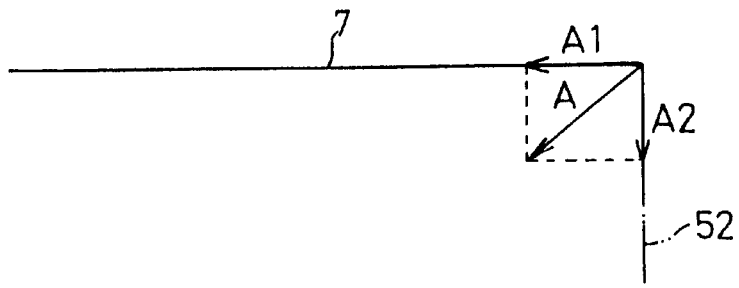
FIGS. 9A–9D are diagrams illustrative of the process of generating a hemmed edge in the method of generating shape data.

Rib data is generated according to a process shown in FIG. 5, which will be described below with reference to FIGS. 9A through 9D. First, at a rib calculation point on the design line 51, as shown in FIG. 9A, a tangent vector A1 on the design surface 7 and a tangent vector A2 on the hypothetical surface 52 are determined, and a direction toward the center of a rib 50 is determined from a vector A which is the resultant of the vectors A1, A2 in a step S5a.

Figure 9B:
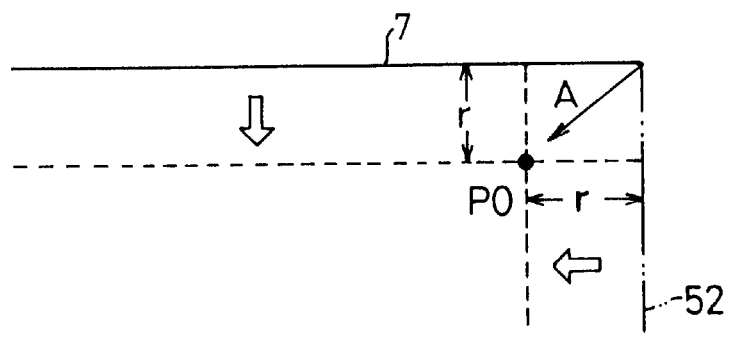

Then, as shown in FIG. 9B, the design surface 7 and the hypothetical surface 52 are displaced toward the center by a radius r represented by the production technique requirements data in a step S5b, and a center P0 (see also FIG. 7) of the rib 50 is determined in a step S5c.

Figure 9C:
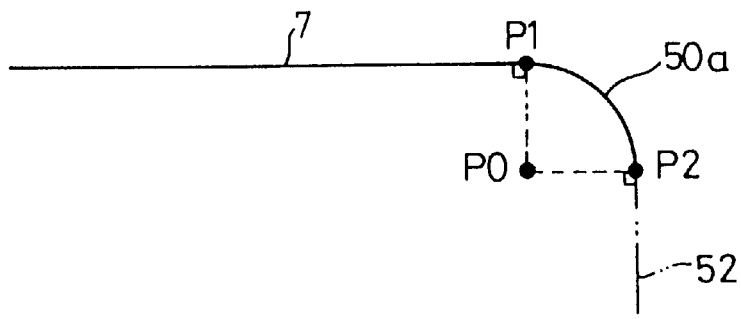

After the center P0 is determined, lines extending from the center P0 perpendicularly to the design surface 7 and the hypothetical surface 52 are set up, as shown in FIG. 9C, and points of intersection between these lines and the design surface 7 and the hypothetical surface 52 are determined as nodes P1, P2 of a face rib 50a in a step S5d. These nodes P1, P2 are starting and ending points, respectively, of the face rib 50a.

Then, using a vector V1 (see FIG. 10) tangential to the design surface 7 at the node P1, a vector V2 tangential to the hypothetical surface 52 at the node P2, and the radius r from the center P0, face rib data of the face rib 50a is calculated according to the COONS formula, for example, in a step S5e. The magnitude v of each of the tangent vectors V1, V2 is set up, using an angle θ between line segments P0–P1, P0–P2, according to the following equation:

$$v=3\cdot(4\cdot(1-\cos(\theta/2))\cdot r)/(3\cdot\sin(\theta/2))$$

Figure 9D:
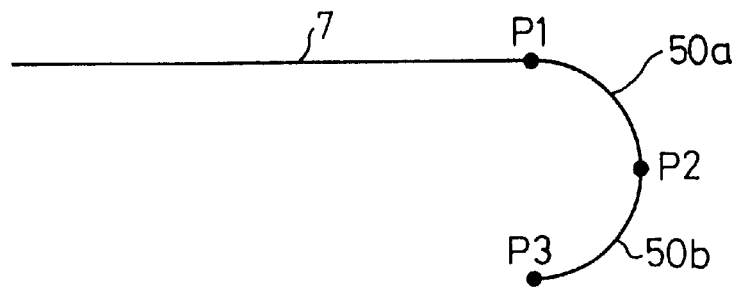
Figure 10:
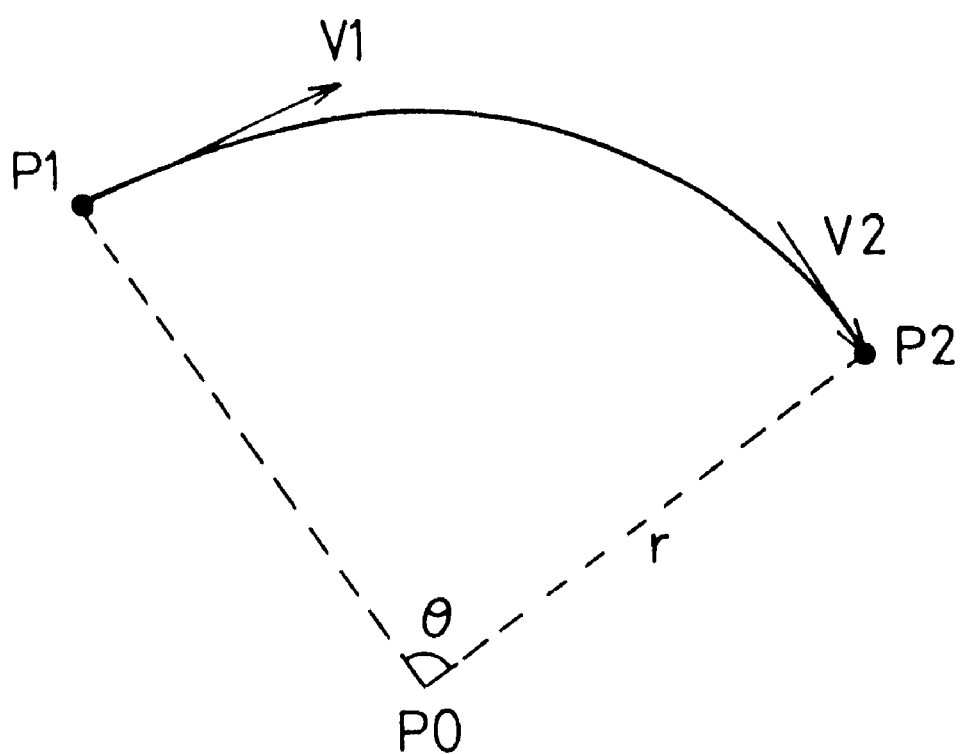
FIG. 10 is a diagram illustrative of a process of generating a curved line.

Then, a node P3 which is an ending point of a back rib 50b is determined in a step S5f. The node P3 is determined as a point that is in point-symmetry relation to the node P1 with respect to the center P0. As shown in FIG. 9D, back rib data of the back rib data 50b to be set up between the nodes P2, P3 is calculated in the same manner as with the face rib data of the face rib data 50a in a step S5g.

The above process of generating rib data is carried out at each of the rib calculation points, thereby generating a data table of ribs 50 shown in FIG. 11. The data table shown in FIG. 11 contains coordinates Xc, Yc, Zc of a rib calculation point on the design line 51, coordinates X0, Y0, Z0 of the center P0, coordinates X1, Y1, Z1 of the node P1, coordinates X2, Y2, Z2 of the node P2, coordinates X3, Y3, Z3 of the node P3, and the rib data of the face and back ribs 50a, 50b, with respect to each of the rib numbers m.

After the rib data of the hemmed edge 46 are calculated, edge lines of the hemmed edge 46 are determined in a step S4f (see FIG. 4), and a new design surface 9 (see FIG. 9D) and a surface loop of the hemmed edge 46 are defined in a step S4g.

Specifically, as shown in FIG. 6, a first edge line 54 of the hemmed edge 46 is set up by a plurality of nodes P1 which are starting points of the face ribs 50a, a second edge line 56 of the hemmed edge 46 is set up by a plurality of nodes P2 which are ending points of the face ribs 50a, and a third edge line 58 of the hemmed edge 46 is set up by a plurality of nodes P3 which are ending points of the back ribs 50b. These edge lines 54, 56, 58 and the ribs 50 define the surface loop of the hemmed edge 46. A surface loop of a new design surface 7 is defined using the edge line 54.

Figure 2D:
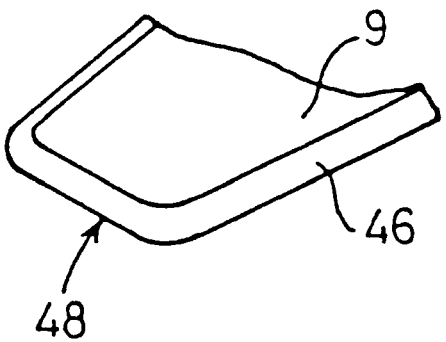

Using the surface loops thus defined, shape data which represents the complete shape surface 48 shown in FIG. 2D is generated.

Based on the generated shape data, the image analyzer 44 displays a three-dimensional design image of an automobile body taking into account the production technique requirements data on the display unit 24. The operator determines whether the design data is acceptable or not based on the displayed three-dimensional design image, and, if necessary, corrects the design data.

Figure 12:
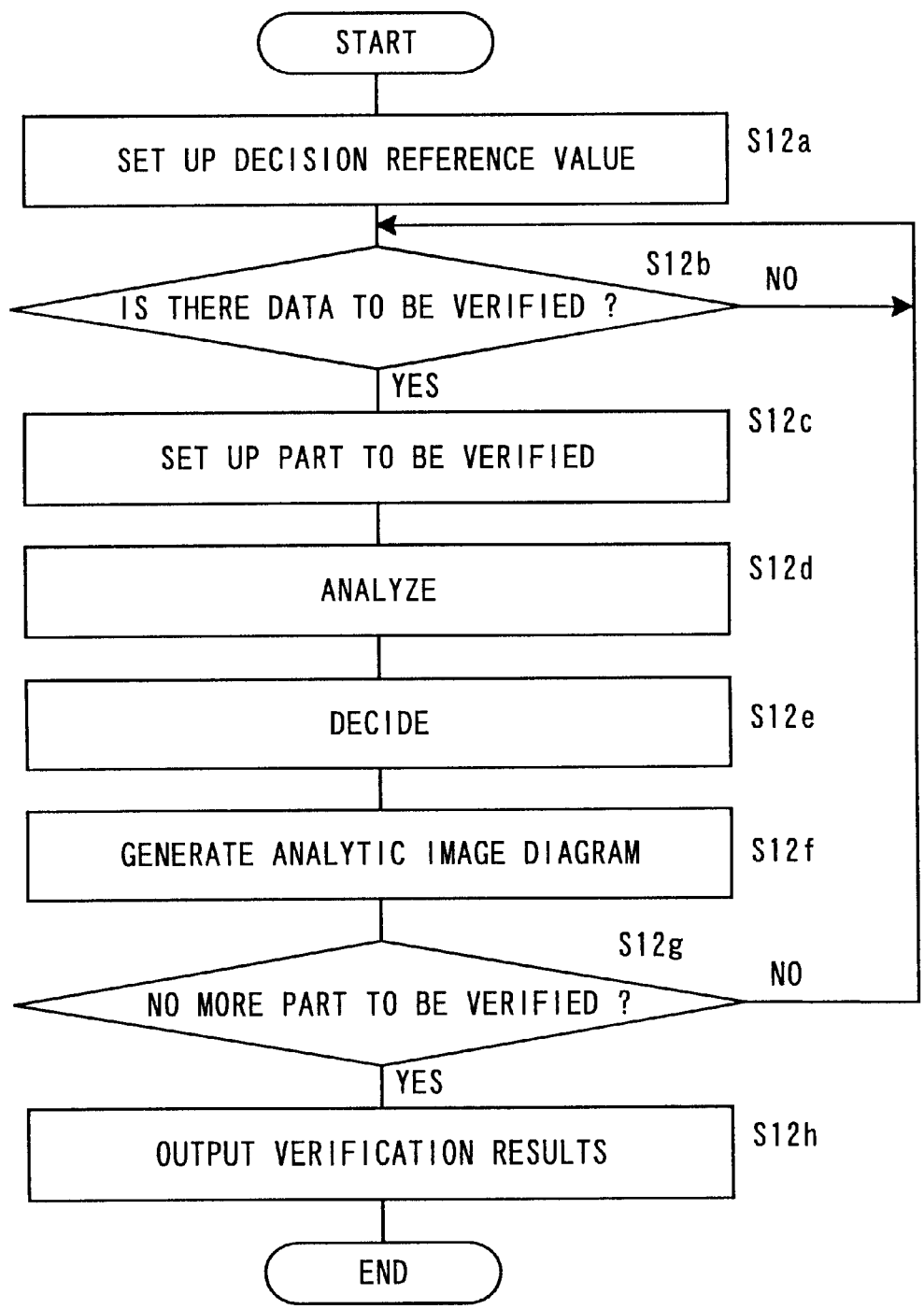
FIG. 12 is a flowchart of a general processing sequence of the method of verifying shape data.

FIG. 12 shows a general processing sequence of the method of verifying shape data according to the present invention. The general processing sequence shown in FIG. 12 is carried out by the curved line curvature analyzer 34, the curved surface curvature analyzer 36, the distance analyzer 40, and the angle analyzer 42.

First, the method of verifying shape data which is carried out by the curved line curvature analyzer 34 will be described below with reference to FIG. 12.

The operator sets up a decision reference value which represents an allowable range for the curvatures of arbitrary curved line on a shape surface as the complete shape surface 48 or the design surface 8, based on the production technique requirements data in a step S12a.

Specifically, if a shape to be finally obtained is a flat shape, for example, because of the weight of a part represented by the shape surface, then since a design surface for the shape surface needs to be of a convex shape having a certain degree of convexity, a curvature corresponding to the certain degree of convexity is set up as a decision reference value based on production technique requirements data. If a part is required to take into account the maximum curvature that can be produced by dies, then the maximum curvature is set up as a decision reference value for the part based on production technique requirements data.

After the decision reference value is set up with respect to the curvature, it is determined whether there is data to be verified or not in a step S12b. If there is data to be verified, then a part to be verified, such as an engine hood, a roof, a fender, or the like, is set up in a step S12c, and thereafter an analyzing process is carried out in a step S12d.

In the analyzing process, a desired curved line N1 (see FIG. 13A) or a desired curved line N2 (see FIG. 13B) on a selected shape surface is designated, and verification points Q are set up at a given sampling pitch on the curved line N1 or N2. The curvature of the curved line N1 or N2 at each of the verification points Q is determined. Thereafter, it is determined whether each of the curvatures falls in the allowable range or not by comparison with the decision reference value in a step S12e. FIG. 14 is a table of verification results in relation to the names of data to be verified, parts to be verified, analyzing functions, decision reference values, and analytic image diagram Nos. The table shown in FIG. 14 is stored in the memory 30, for example.

Line segments M having lengths calculated depending on the magnitudes, i.e., the radii, of the respective curvatures are determined from the curvatures, colors are set up which depend on the lengths of the line segments M, and an analytic image diagram to be displayed is generated in a step S12f.

The analyzing process and the generation of an analytic image diagram are carried out with respect to each of desired verification items established by the operator in a step S12g.

After the analyzing process and the generation of an analytic image diagram are carried out with respect to each of the desired verification items, a designated analytic image diagram is displayed on the display unit 24 in a step S12h.

Figure 15:
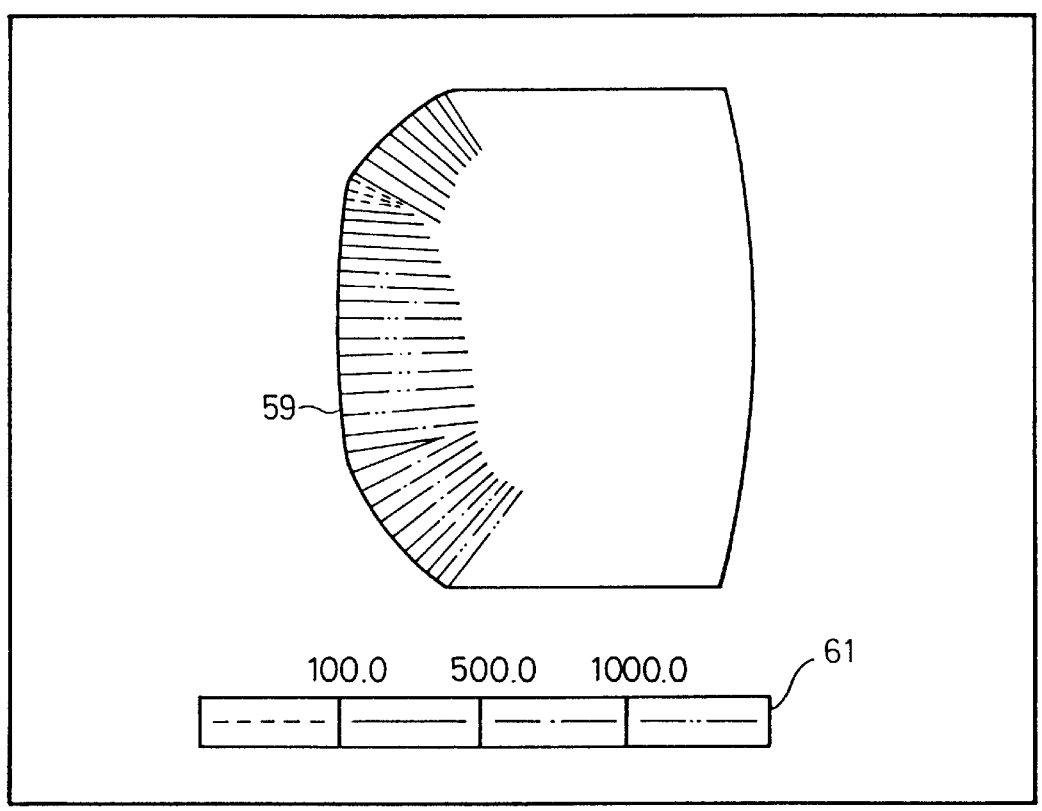
FIG. 15 is a view showing a displayed image of an analytic image diagram of analyzed curvatures of a curved line.

FIG. 15 shows an analytic image diagram which is generated as a result of the analyzing process carried out by the curved line curvature analyzer 34, and displayed on the display unit 24. The displayed analytic image diagram includes a desired curved line 59 on the complete shape surface 48 or the design surface 6 which is selected, and a number of line segments M extending from the curved lines 59 toward the centers of the curvatures of the curved lines 59, the line segments M having calculated lengths and colors depending on the lengths. In FIG. 15, the colors of the line segments M are shown as different line types. The values of the curvatures which are represented by the colors of the line segments M are displayed on a scale 61. The operator can easily verify the curvatures of the curved line 59 from the displayed colors in the analytic image diagram. The lengths of the line segments M may not be indicated by colors, but by line types, markers, gradations, or numerical values themselves.

Figure 13A:
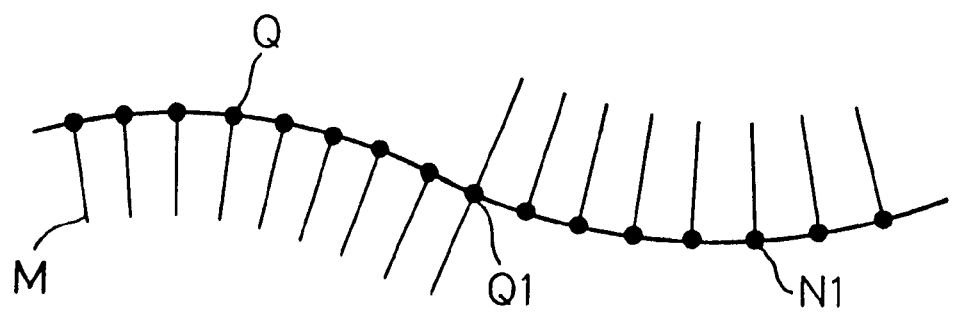
FIGS. 13A and 13B are diagrams showing line segments set up for curved lines with respect to curvatures thereof.
Figure 13B:
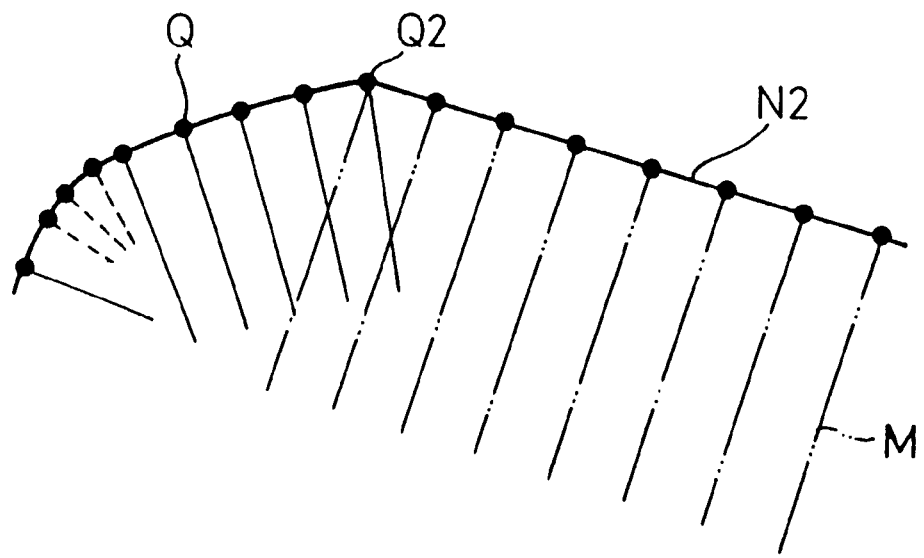

As shown in FIG. 13A. the verification points Q includes a verification point Q1 where the directions of the line segments M change. In FIG. 13A, the operator can recognize that at the verification point Q1, the curved line Ni changes from a convex shape to a concave shape. As shown in FIG. 13B, the verification points Q includes a verification point Q2 where nearby line segments M cross each other. In FIG. 13B, the operator can recognize that the curved line N2 is bent at the verification point Q2.

Since a decision reference value which represents an allowable range for the curvatures of an arbitrary curved line is established on the basis of production technique requirements data for comparison with the line segments M which are displayed in respective lengths and colors depending on the radii of the curvatures of the curved lines and also in directions depending on the positions of the centers of the curvatures. Based on the displayed lengths, colors, and directions of the line segments M, the operator can immediately decide whether the curvature of the curved line 59 (see FIG. 15) at a point where the line segments M change from solid lines to dotted lines, for example, falls outside of the allowable range or not.

The method of verifying shape data which is carried out by the curved surface curvature analyzer 36 will be described below with reference to FIG. 12.

The operator sets up a decision reference value which represents an allowable range for a Gaussian curvature K and an average curvature H of an automobile body shape surface at a desired verification point on the complete shape surface 48 or the design surface 6, based on the production technique requirements data in the step S12a.

Figure 16A:
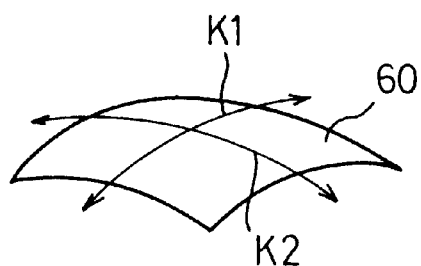
FIGS. 16A–16D are diagrams showing the relationship between the shapes of curved surfaces and Gaussian and average curvatures.
Figure 16B:
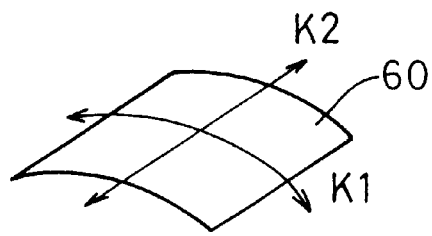
Figure 16C:
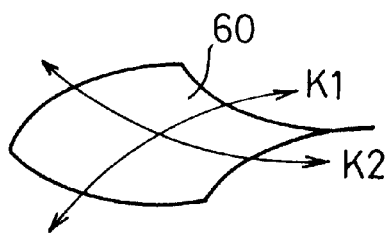
Figure 16D:
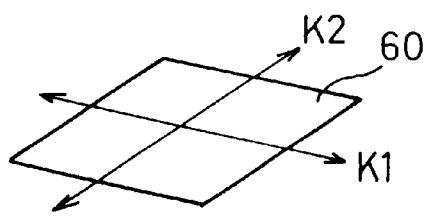

As shown in FIG. 16A, the Gaussian curvature K is represented by the product of a maximum curvature K1 and a minimum curvature K2 of a shape surface 60, and the average curvature H is represented by the average of the maximum curvature K1 and the minimum curvature K2. If the Gaussian curvature K is K>0 and the average curvature H is H>0 as shown in FIG. 16A, then the shape surface 60 is of a completely convex shape. If the Gaussian curvature K is K=0 and the average curvature H is H>0 as shown in FIG. 16B, then the shape surface 60 is of a partly cylindrical shape. If the Gaussian curvature K is K<0 as shown in FIG. 16C, then the shape surface 60 is of both concave and convex shapes. If the Gaussian curvature K is K=0 and the average curvature H is H=0 as shown in FIG. 16D, then the shape surface 60 is of a flat shape. FIG. 17 is a table illustrative of the relationship between the shapes of curved surfaces and Gaussian and average curvatures.

If a shape to be finally obtained is a flat shape, for example, because of the weight of a part represented by the shape surface 60, then since a design surface for the shape surface 60 needs to be of a convex shape having a certain degree of convexity, a positive Gaussian curvature K and a positive average curvature H which correspond to the certain degree of convexity are set up as a decision reference value based on production technique requirements data. If a part is required to take into account the maximum curvature that can be produced by dies, then the maximum curvature based on production technique requirements data is set up as a decision reference value which represents absolute values of a Gaussian curvature K and an average curvature H.

After the decision reference value is set up, it is determined whether there is data to be verified or not in the step S12b. If there is data to be verified, then a part to be verified, such as an engine hood, a roof, a fender, or the like, is set up in the step S12c, and thereafter an analyzing process is carried out in the step S12d.

In the analyzing process, a plurality of verification points are set up with respect to the shape surface 60, and a Gaussian curvature K and an average curvature H are calculated at each of the verification points. It is determined whether the calculated Gaussian and average curvatures K, H fall in the allowable range or not by comparison with the decision reference value in the step S12e. Verification results in relation to the names of data to be verified, parts to be verified, analyzing functions, decision reference values, and analytic image diagram Nos. as shown in FIG. 14 are stored in the memory 30.

Colors depending on the calculated Gaussian and average curvatures K, H at the verification points are set up, and an analytic image diagram to be displayed is generated in the step S12f.

The analyzing process and the generation of an analytic image diagram are carried out with respect to each of desired verification items established by the operator in the step S12g.

After the analyzing process and the generation of an analytic image diagram are carried out with respect to each of the desired verification items, a designated analytic image diagram is displayed on the display unit 24 in the step S12h.

Figure 18:
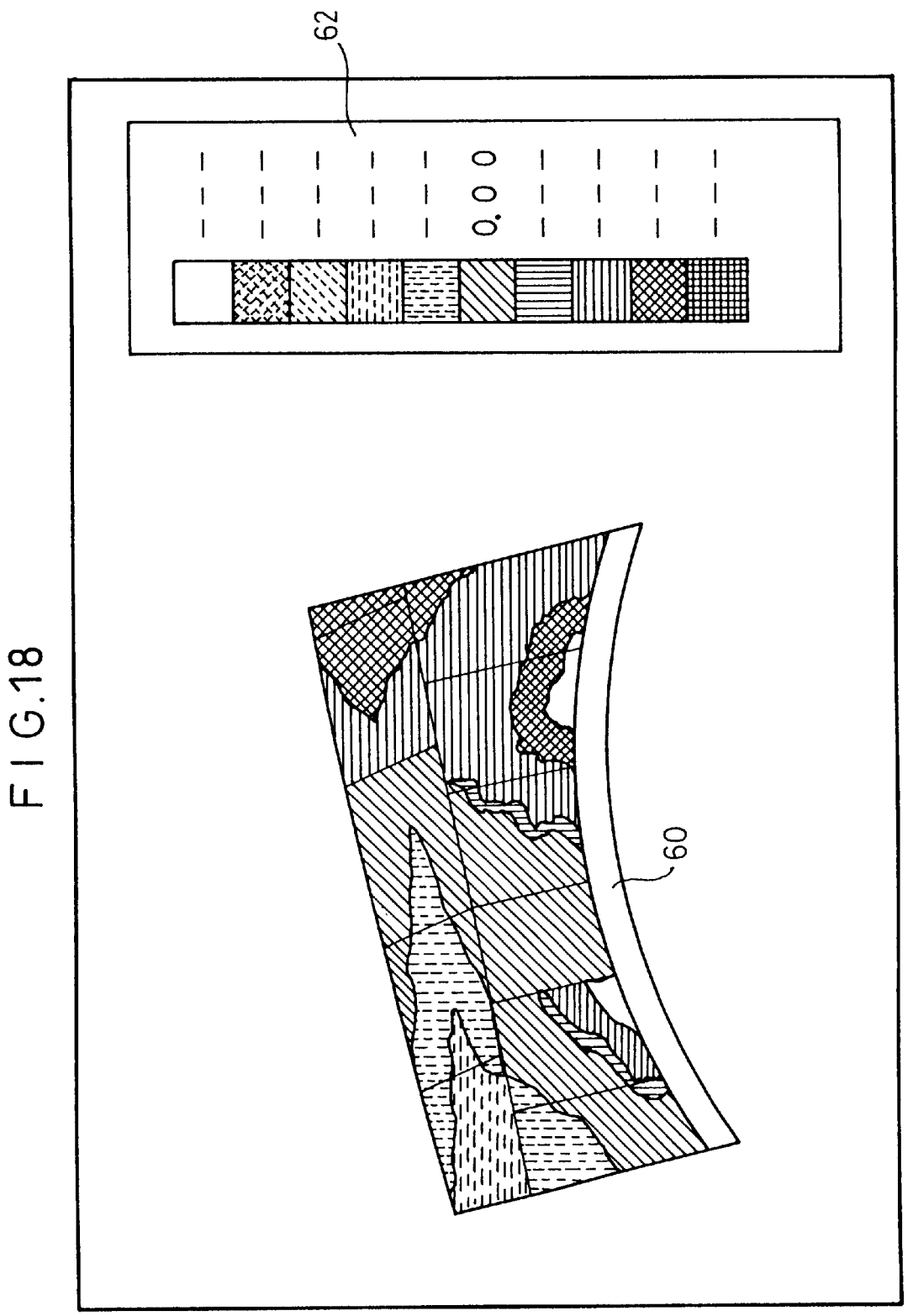
FIG. 18 is a view showing a displayed image of analyzed curvatures of curved surfaces.

FIG. 18 shows an analytic image diagram which is generated as a result of the analyzing process carried out by the curved surface curvature analyzer 36, and displayed on the display unit 24. The displayed image includes Gaussian curvatures K displayed at various levels in a scale 62, and the analytic image diagram comprises Gaussian curvatures K as different colors at the respective verification colors. In FIG. 18, the colors of the Gaussian curvatures K are shown as different line types. The operator can easily verify surface the convexities and concavities of the shape surface 60 from the displayed colors in the analytic image diagram. The Gaussian curvatures K may not be indicated by colors, but by line types, markers, gradations, or numerical values themselves. In addition, some representations based on both Gaussian and average curvatures K, H may be displayed to provide more accurate information of the convexities and concavities of the shape surface 60, as shown in FIG. 17.

The method of verifying shape data which is carried out by the distance analyzer 40 will be described below with reference to FIG. 12.

Figure 19:
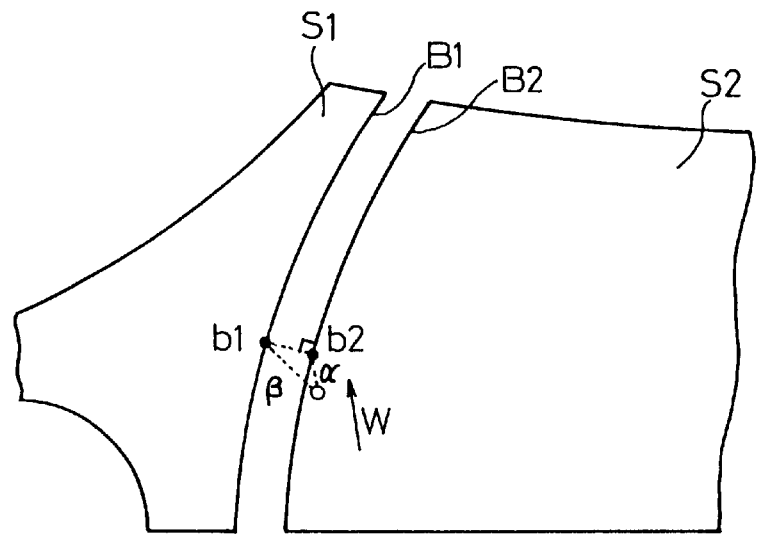
FIG. 19 is a view showing the relationship between the offset and the distance between shapes and the direction of view.

The operator sets up a decision reference value which represents an allowable range for an offset $\alpha$ and a distance $\beta$ between outer contours B1, B2 of two shape surfaces S1, S2, as shown in FIG. 19, based on the production technique requirements data in the step S12a.

After the decision reference value is set up, it is determined whether there is data to be verified or not in the step S12b. If there is data to be verified, then a part to be verified, such as an engine hood, a roof, a fender, or the like, is set up in the step S12c, and thereafter an analyzing process is carried out in the step S12d. It is assumed that the outer contours B1, B2 of the shape surfaces S1, S2 shown in FIG. 19 are set up as the part to be verified.

The shape surfaces S1, S2 normally has a hemmed edge 46 as shape data as described above with reference to FIG. 2D. Therefore, the outer contours B1, B2 positionally vary depending on a direction W of view. To avoid this, a line parallel to the direction W of view is moved along the hemmed edge 46, producing a succession of points of contact between the line and the hemmed edge 46 as representing an outer contour. In this manner, the outer contours B1, B2 are determined.

Figure 20:
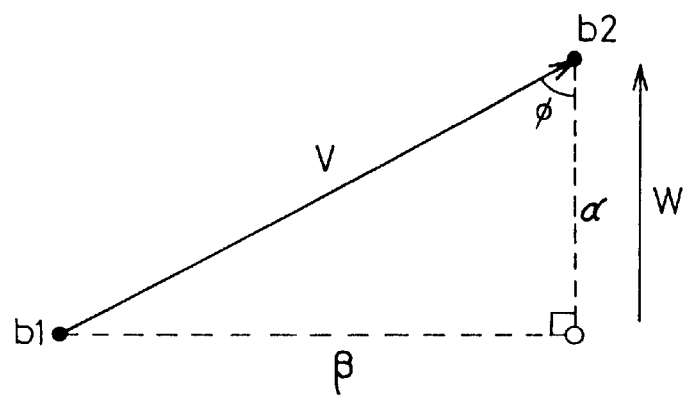
FIG. 20 is a diagram illustrative of a process of calculating the offset and the distance.

The operator first designates an arbitrary direction W of view in which the shape surfaces S1, S2 are viewed. Then, a verification point b1 for calculating an offset $\alpha$ and a distance $\beta$ is established on the outer contour B1 of the shape surface S1. A line is drawn from the verification point b1 perpendicularly to the outer contour B2 of the shape surface S2, and a point where the line crosses the outer contour B2 is determined as a verification point b2. A vector extending from the verification point b1 toward the verification point b2 is represented by V. In FIG. 20, if the angle between the vector V and the direction W of view is represented by $\phi$, then an offset $\alpha$ between the verification points b1, b2 as viewed in the direction W is determined as a first scalar quantity which is a component of the vector V along the direction W, according to the equation:

$$\alpha = |V| \cos \phi.$$

A distance $\beta$ is determined as a second scalar quantity which is a component of the vector V along a direction normal to the direction W, according to the equation:

$$\beta = |V| \sin \phi.$$

In this manner, the offset $\alpha$ and the distance $\beta$ between the verification points b1, b2 as viewed in the direction W are determined. Similarly, offsets $\alpha$ and the distances $\beta$ at a given pitch along the outer contours B1, B2 can be determined.

Based on the offsets $\alpha$ and the distances $\beta$ thus determined, a status between the shape surfaces S1, S2 is analyzed and judged in the step S12e. Verification results in relation to the names of data to be verified, parts to be verified, analyzing functions, decision reference values, and analytic image diagram Nos. as shown in FIG. 14 are stored in the memory 30.

Figure 21:
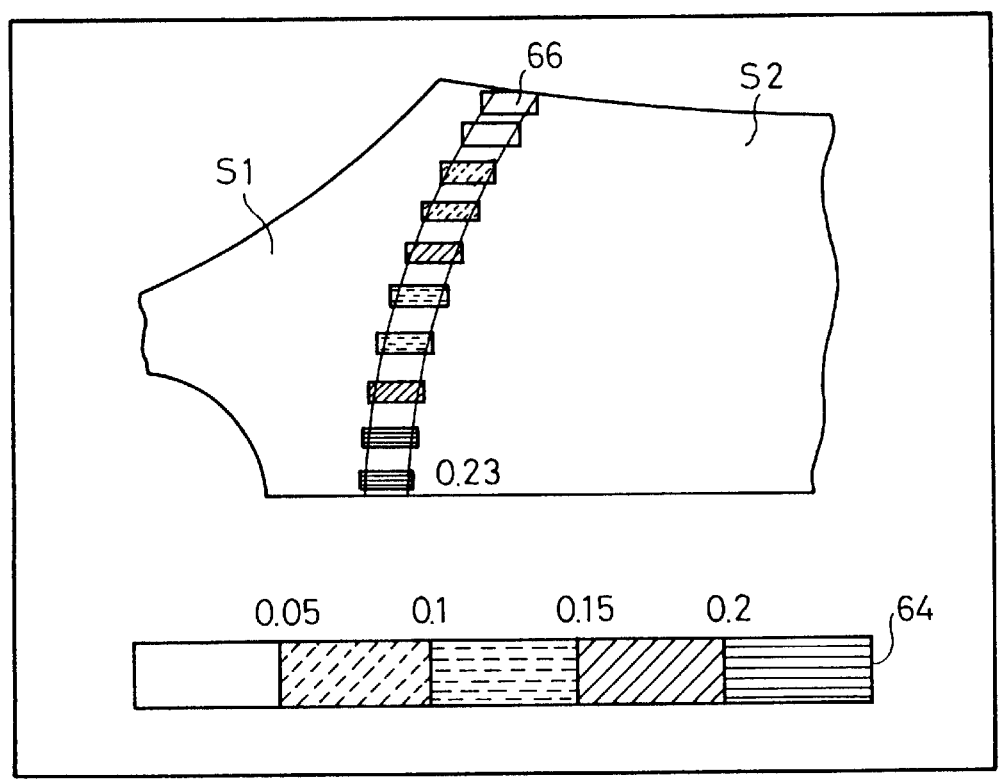
FIG. 21 is a view showing a displayed image of analyzed distances.

Display patterns and colors depending on the offsets $\alpha$ and the distances $\beta$ are set up, and an analytic image diagram to be displayed is generated in the step S12f. For example, as shown in FIG. 21, the analytic image diagram includes steps $\alpha$ represented in a scale 64 and colored marks 66 representing respective ranges of steps $\alpha$ and positioned at the verification points b1, b2 of the shape surfaces S1, S2, the steps a being also indicated by numerical values. The analytic image diagram may similarly include distances $\beta$.

The analyzing process and the generation of an analytic image diagram are carried out with respect to each of desired verification items established by the operator in the step S12g.

After the analyzing process and the generation of an analytic image diagram are carried out with respect to each of the desired verification items, a designated analytic image diagram is displayed on the display unit 24 in the step S12h.

FIG. 21 shows an analytic image diagram which is generated as a result of the analyzing process carried out by the distance analyzer 40, and displayed on the display unit 24. The displayed image includes marks 66 indicating steps a between the shaped surfaces S1, S2. The operator can easily verify the steps a from the displayed colors thereof. If information indicating whether each of the steps a falls in the allowable range based on the decision reference value is displayed, then the operator can also easily judge the steps $\alpha$. The steps a may not be indicated by colors, but by line types, markers, gradations, or numerical values themselves.

The method of verifying shape data which is carried out by the angle analyzer 42 will be described below with reference to FIG. 12.

The operator sets up a decision reference value which represents an allowable range for an angle at which a plurality of shape surfaces cross each other at their boundary, based on the production technique requirements data in the step S12a.

After the decision reference value is set up, it is determined whether there is data to be verified or not in the step S12b. If there is data to be verified, then a part to be verified, such as an engine hood, a roof, a fender, or the like, is set up in the step S12c, and thereafter an analyzing process is carried out in the step S12d.

Figure 22:
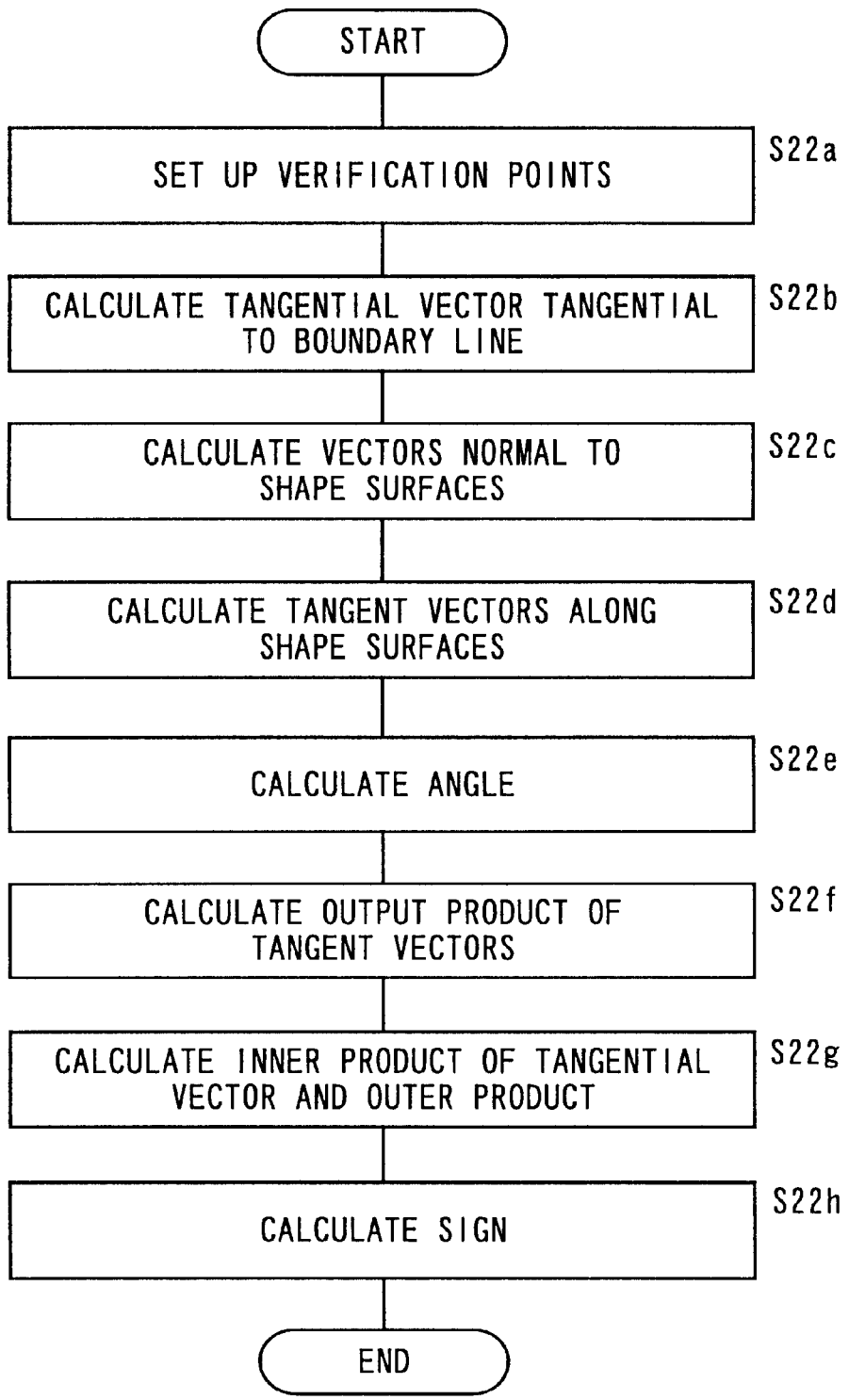
FIG. 22 is a flowchart of an angle analyzing process in the method of verifying shape data.
Figure 23:
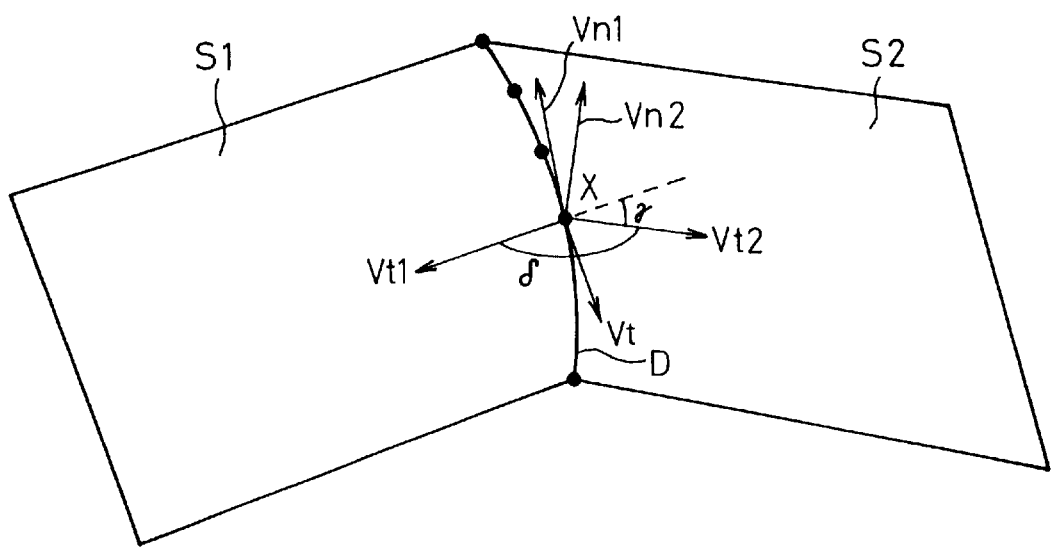
FIG. 23 is a diagram illustrative of the angle analyzing process.

FIG. 22 shows the analyzing process which is performed by the angle analyzer 42. The analyzing process shown in FIG. 22 will be described below. As shown in FIG. 23, a plurality of verification points X are set up at a predetermined sampling pitch on a boundary line D between shape surfaces S1, S2 which are a part to be verified, in a step S22a. Then, at each of the verification points X, a vector Vt tangential to the boundary line D is determined in a step S22b, and vectors Vn1, Vn2 normal to the shape surfaces S1, S2 are determined in a step S22c. Thereafter, in a step S22d, the outer product of the tangential vector Vt and the normal vector Vn1 and the outer product of an inverse vector of the tangential vector Vt and the normal vector Vn2 are determined as tangent vectors Vt1, Vt2 along the shape surfaces S1, S2 as follows:

$$Vt1 = Vt \times Vn1$$

$$Vt2 = -Vt \times Vn2.$$

The angle of the tangent vector Vt2 with respect to the tangent vector Vt1 is regarded as an angle $\gamma$ between the shape surfaces S1, S2 at the verification point X. The angle γ is calculated, using the inner product of the tangent vectors Vt1, Vt2, as follows:

$$\cos \gamma = Vt1 \cdot Vt2/|Vt1| \cdot |Vt2|$$

in a step S22e. From this equation, there is obtained angle γ (0°≦γ≦180°) of the shape surface S2 with respect to the shape surface S1.

If the shape surfaces S1, S2 shown in FIG. 23 are joined in a convex configuration, then when γ=0° (y=180°−δ), the shape surfaces S1, S2 are smoothly joined to each other at the verification point X.

In order to calculate the sign of the angle γ, the outer product Vt3 of the tangent vectors Vt1, Vt2 is determined as:

$$Vt3 = Vt1 \times Vt2$$

in a step S22f. Then, the inner product of the outer product vector Vt3 and the tangential vector Vt is determined in a step S22g, and its sign is calculated in a step S22h. If the shape surfaces S1, S2 are bent in a convex configuration, then the outer product vector Vt3 is in the same direction as the tangential vector Vt, and if the shape surfaces S1, S2 are bent in a concave configuration, then the outer product vector Vt3 is in the direction opposite to the tangential vector Vt. Therefore, the sign of the above inner product can be calculated as the sign of the angle γ.

Based on the angle γ thus determined and its sign, a joined state between the shape surfaces S1, S2 is analyzed and determined in the step S12e. For example, if the decision reference value is represented by ω and the angle γ is in the range of −ω<γ<+ω, then the joined state between the shape surfaces S1, S2 is judged as being allowable. Verification results in relation to the names of data to be verified, parts to be verified, analyzing functions, decision reference values, and analytic image diagram Nos. as shown in FIG. 14 are stored in the memory 30.

From the angles γ and its signs, display patterns and colors depending on the magnitudes of the angles γ are established, and an analytic image diagram to be displayed is generated in the step S12f. For example, as shown in FIG. 24, if the angle γ is in the range of −ω<γ<+ω, then the joined state is displayed as "Z" in green. If the angle γ is in the range of +ω<γ<+ε, then the joined state is displayed as "∩", indicating a convex configuration, in pale aqua. If the angle γ is +ε<γ, then the joined state is displayed as "∩", indicating a convex configuration, in white. If the angle γ is in the range of −ω>γ>−ε, then the joined state is displayed as "∪", indicating a concave configuration, in yellow. If the angle γ is in the range of −ε>γ, then the joined state is displayed as "∪", indicating a concave configuration, in red.

The analyzing process and the generation of an analytic image diagram are carried out with respect to each of desired verification items established by the operator in the step S12g.

After the analyzing process and the generation of an analytic image diagram are carried out with respect to each of the desired verification items, a designated analytic image diagram is displayed on the display unit 24 in the step S12h.

Figure 25:
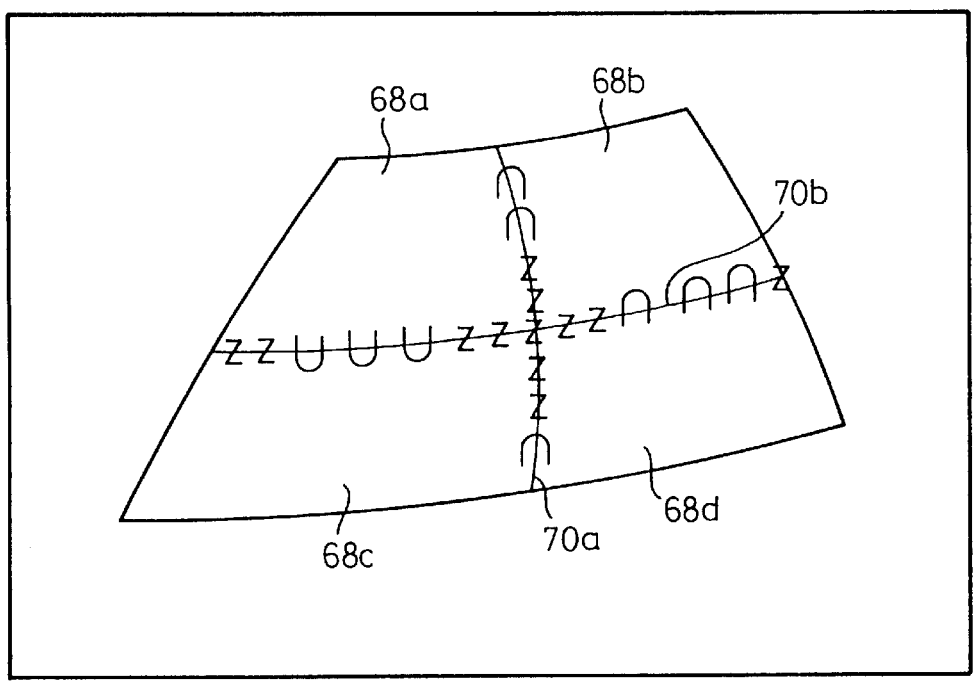
FIG. 25 is a view showing a displayed image of results of the angle analyzing process.

FIG. 25 shows an analytic image diagram generated by the angle analyzer 42. In the analytic image diagram, the angles y and their signs are displayed in display patterns and colors set up as shown in FIG. 24, on boundary lines 70a, 70b between a plurality of selected shape surfaces 68a–68d. The operator can easily recognize allowable joined states from the displayed colors, and also decide whether each of the joined states is concave or convex from the display pattern.

Figure 26:
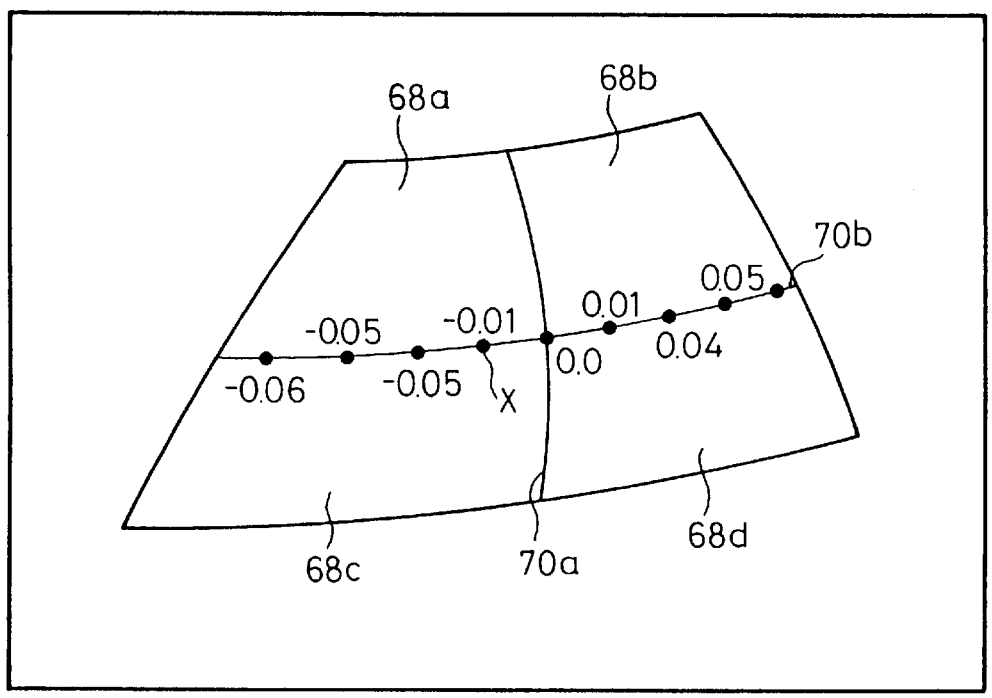
FIG. 26 is a view showing a displayed image of results of the angle analyzing process.
Figure 27:
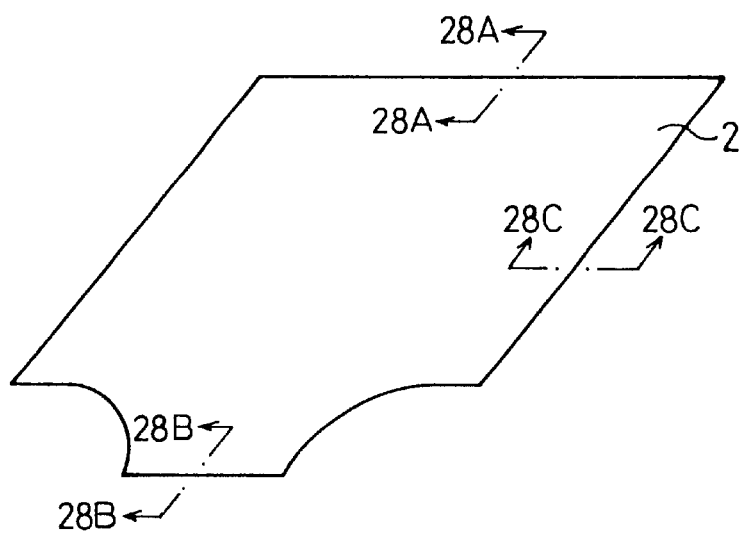
FIG. 27 is a perspective view of a design surface.

Numerical values of angles γ and their signs may be displayed at respective verification points X in an analytic image diagram, as shown in FIG. 26.

The cross section analyzer 38 determines a desired cross-sectional shape of a three-dimensional design image, and displays the determined cross-sectional shape on the display unit 24. The operator can decide whether the cross-sectional shape is acceptable or not based on the displayed cross-sectional shape.

Although a certain preferred embodiment of the present invention has been shown and described in detail, it should be understood that various changes and modifications may be made therein without departing from the scope of the appended claims.

What is claimed is:

1. A method of generating shape data with a CAD system to form a hemmed edge to be added to a design surface for a designed product, based on production technique requirements data of the product, comprising the steps of:

setting up rib calculation points for forming the hemmed edge on a peripheral edge of the design surface;

setting up a hypothetical surface separate from said design surface on the peripheral edge based on the production technique requirements data;

determining arcs in contact with said design surface and said hypothetical surface as rib data at said rib calculation points; and generating shape data to form said hemmed edge from said rib data, wherein said shape data comprises face rib data for forming face ribs extending from said design surface to said hypothetical surface and back rib data for forming back ribs extending from said hypothetical surface to a reverse side of said design surface.

2. A method according to claim 1, wherein said step of determining arcs as rib data comprises the steps of determining a resultant vector which is the result of a tangent vector starting from each of the rib calculation points and tangential to said design surface and a vector starting from each of the rib calculation points and tangential to said hypothetical surface, setting up a center positioned on the resultant vector and spaced from said design surface and said hypothetical surface by a distance based on said production technique requirements data, and determining rib data according to a COONS formula from a tangent vector tangential to said design surface and passing through a point of intersection between a line segment extending from said center perpendicularly to said design surface and said design surface, a tangent vector tangential to said hypothetical surface and passing through a point of intersection between a line segment extending from said center perpendicularly to said hypothetical surface and said hypothetical surface, and said distance.

3. A method according to claim 2, wherein each of said tangent vectors has a magnitude expressed, using an angle between said line segments, according to the following equation:

$$v = 3 \cdot (4 \cdot (1 - \cos(\theta/2)) \cdot r)/(3 \cdot \sin(\theta/2)).$$

4. A method according to claim 1, wherein a surface loop is defined with respect to said hemmed edge.

5. A method of verifying shape data of a designed product with a CAD system, comprising the steps of:

designating a curved line on a shape surface of the product which is represented by the shape data;

determining curvatures of said curved line at a predetermined sampling pitch;

determining line segments having lengths corresponding to magnitudes of said curvatures, wherein said line segments are shorter in length as the magnitudes of curvature become greater;

displaying said line segments as lines lying perpendicular to a tangent of said curved line along said curved line in combination with attributes thereof; and verifying said shape data based on the displayed line segments.

6. A method according to claim 5, wherein said attributes comprise colors depending on the magnitudes of said curvatures.

7. A method according to claim 5, further comprising the steps of:

setting up a decision reference value according to production technique requirements data; and comparing said magnitudes of said curvatures with said decision reference value to decide whether said magnitudes of said curvatures fall in a predetermined allowable range.

8. A method of verifying shape data of a designed product with a CAD system, comprising the steps of:

setting up a plurality of verification points on a shape surface represented by the shape data;

determining two mutually perpendicular curvatures of the shape surface at said verification points, wherein said curvatures include a Gaussian curvature and an average curvature at each of said verification points;

comparing said curvatures with a decision reference value set up according to production technique requirements data, wherein said decision reference value is set up with respect to both said Gaussian curvature and said average curvature;

displaying said curvatures at said verification points; and verifying said shape data based on the displayed curvatures and results produced by comparing said curvatures with said decision reference values.

9. A method according to claim 8, wherein said step of displaying said curvatures comprises the step of displaying said curvatures in combination with attributes thereof.

10. A method according to claim 9, wherein said attributes comprise colors depending on magnitudes of said curvatures.

11. A method according to claim 10, wherein said Gaussian curvature comprises a product of a maximum curvature and a minimum curvature of said shape surface.

12. A method according to claim 10, wherein said average curvature comprises an average of a maximum curvature and a minimum curvature of said shape surface.

13. A method of verifying shape data of a designed product with a CAD system, comprising the steps of:

selecting two shape surfaces to be verified which have respective adjacent outer contours, among shape surfaces represented by the shape data;

designating a direction of view W in which the selected two shape surfaces are viewed;

determining a line segment between verification points established on said outer contours, said line segment serving as a vector V;

determining a first scalar quantity $\alpha$ representing a component of said vector v along said direction of view W defined by the equation $\alpha=|V|\cos\phi$ and a second scalar quantity $\beta$ representing a component of said vector V along a direction normal to said direction of view W defined by the equation $\alpha=|V|\sin\phi$, wherein $\phi$ is an angle between the vector V and the direction of view W;

verifying said first scalar quantity as an offset between said outer contours and said second scalar quantity as a distance between said outer contours; and displaying at least one of said offset and said distance in combination with an identifier depending thereon at said verification points.

14. A method according to claim 13, wherein said outer contours comprise respective groups of points of contact between lines parallel to said direction of view and said selected two shape surfaces.

15. A method according to claim 14, wherein said identifier comprises a color depending on said offset or said distance.

16. A method of verifying shape date of a designed product with a CAD system, comprising the steps of:

setting up a verification point on a boundary line between a plurality of shape surfaces represented by the shape data;

determining a tangential vector tangential to said boundary line at said verification point;

determining a first normal vector normal to one of said shape surfaces at said verification point, and a second normal vector normal to another of said shape surfaces at said verification point;

determining outer products of said tangential vector and said first and second normal vectors, wherein said outer products define a pair of tangent vectors tangential to said shape surfaces at said verification point;

verifying a joined state between said shape surfaces at said boundary line based on an angular relationship between said pair of tangent vectors; and displaying said joined state as data indicative of an angle between said pair of tangent vectors, together with an image of said shape surfaces including said boundary line.

17. A method according to claim 16, wherein the angular relationship between said tangent vectors is determined as an inner product thereof.

18. A method according to claim 16, further comprising the steps of:

determining the outer product of said tangent vectors;

determining a sign of the inner product of said outer product and said tangential vector; and verifying a joined state between said shape surfaces at said boundary line based on said sign.

19. A method according to claim 16, further comprising the step of:

displaying said joined state as a color depending on an angle between said tangent vectors at said verification point.

20. A method according to claim 16, further comprising the step of:

displaying said joined state as numerical data depending on an angle between said tangent vectors at said verification point.

\* \* \* \* \*